US010111364B2

(12) United States Patent
Arvelo et al.

(10) Patent No.: US 10,111,364 B2
(45) Date of Patent: *Oct. 23, 2018

(54) COUPLING ASSEMBLIES FOR CONNECTING FLUID-CARRYING COMPONENTS

(71) Applicant: INTERNATIONAL BUSINESS MACHINES CORPORATION, Armonk, NY (US)

(72) Inventors: Amilcar R. Arvelo, Poughkeepsie, NY (US); Alan F. Benner, Poughkeepsie, NY (US); Michael J. Ellsworth, Jr., Poughkeepsie, NY (US); Eric J. McKeever, Poughkeepsie, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 546 days.

This patent is subject to a terminal disclaimer.

(21) Appl. No.: 14/717,009

(22) Filed: May 20, 2015

(65) Prior Publication Data

US 2016/0345466 A1 Nov. 24, 2016

(51) Int. Cl.
*F16L 15/08* (2006.01)
*H05K 7/20* (2006.01)
*F16L 37/107* (2006.01)

(52) U.S. Cl.
CPC ..... *H05K 7/20627* (2013.01); *H05K 7/20272* (2013.01); *H05K 7/20772* (2013.01); *F16L 15/08* (2013.01); *F16L 37/107* (2013.01)

(58) Field of Classification Search
CPC ........... H05K 7/20627; H05K 7/20772; H05K 7/20272; F16L 37/107; F16L 15/08;
(Continued)

(56) References Cited

U.S. PATENT DOCUMENTS 549,510 A * 11/1895 Hall ................. F16L 19/0218
285/354
557,296 A * 3/1896 Wigan ................. F16L 17/035
277/623
(Continued)

OTHER PUBLICATIONS

Arvelo, et al., Office Action for U.S. Appl. No. 14/846,905, filed Sep. 7, 2015, dated Jun. 28, 2017 (9 pages).
(Continued)

*Primary Examiner* — David Bochna
*Assistant Examiner* — James A Linford
(74) *Attorney, Agent, or Firm* — Tihon Poltavets, Esq.; Kevin P. Radigan, Esq.; Heslin Rothenberg Farley & Mesiti P.C.

(57) ABSTRACT

Coupling assemblies for connecting fluid-carrying components are provided. The coupling assemblies include, for instance: a socket fitting with a first opening and a second opening in fluid communication through the fitting, the first opening being sized to accommodate a first fluid-carrying component, and the second opening being sized to accommodate a second fluid-carrying component; a sleeve, the sleeve encircling the socket fitting and being rotatable relative to the fitting, and the sleeve including a first locking feature; and a second locking feature associated with one of the fluid-carrying components. The second locking feature is positioned and sized to engage the first locking feature of the sleeve when the one fluid-carrying component is inserted into the socket fitting. Once engaged, rotating of the sleeve locks the first and second locking features together to secure the one fluid-carrying component to the socket fitting.

8 Claims, 17 Drawing Sheets

(58) Field of Classification Search
CPC ....... F16L 15/04; F16L 19/0212; F16L 19/02; F16L 25/025; F16L 21/002; F16L 21/005; F16L 21/022; F16L 21/03; F16L 21/04
USPC .............. 285/337, 369, 374, 392, 354, 386
See application file for complete search history.

(56) References Cited

U.S. PATENT DOCUMENTS

| | | | | |
|---|---|---|---|---|
| 765,225 | A | | 7/1904 | Colin |
| 1,330,327 | A | * | 2/1920 | Marshall ............... F16L 15/006 285/392 |
| 1,937,982 | A | * | 12/1933 | Rudolph ............... F16L 37/107 137/535 |
| 2,653,040 | A | * | 9/1953 | Galluppi ............. F16L 27/1136 285/230 |
| 3,405,957 | A | * | 10/1968 | Chakroff ............. F16L 27/1136 285/233 |
| 3,596,932 | A | * | 8/1971 | Kinsey ................. F16L 17/073 285/111 |
| 3,892,458 | A | | 7/1975 | Clark |
| 4,313,828 | A | | 2/1982 | Brownlee |
| 5,215,336 | A | | 6/1993 | Worthing |
| 5,651,885 | A | | 7/1997 | Schick |
| 5,678,607 | A | * | 10/1997 | Krywitsky ............ F16L 15/001 138/89 |
| 6,152,496 | A | | 11/2000 | Kouda |
| 6,206,433 | B1 | | 3/2001 | Bloomer |
| 6,713,711 | B2 | | 3/2004 | Conway et al. |
| 6,981,721 | B2 | | 1/2006 | Karasawa |
| 7,420,808 | B2 | | 9/2008 | Campbell et al. |
| 7,593,227 | B2 | | 9/2009 | Campbell et al. |
| 8,246,084 | B2 | | 8/2012 | Poddar |
| 8,297,658 | B2 | | 10/2012 | Le Quere |
| 8,596,689 | B2 | | 12/2013 | Simon et al. |
| 8,867,205 | B2 | | 10/2014 | Eagle |
| 2005/0099003 | A1 | * | 5/2005 | Tarara ................... F16L 21/005 285/236 |
| 2012/0160932 | A1 | | 6/2012 | White |
| 2014/0254098 | A1 | | 9/2014 | Arvelo et al. |

OTHER PUBLICATIONS

Arvelo, Amilcar R., "Coupling Assemblies for Connecting Fluid-Carrying Components", U.S. Appl. No. 14/846,905, filed Sep. 7, 2015 (51 pages).

Arvelo, Amilcar R., "List of IBM Patents and/or Patent Applications Treated as Related", U.S. Appl. No. 14/717,009, filed May 20, 2015, dated Mar. 10, 2016 (2 pages).

Colgan et al., "Releasable, Threadless Conduit Connector for Liquid Manifold", U.S. Appl. No. 14/469,891, filed Aug. 27, 2014 (58 pages).

Arvelo et al., "Tapering Couplers for Connecting Fluid Flow Components", U.S. Appl. No. 14/482,147, filed Sep. 10, 2014 (41 pages).

* cited by examiner

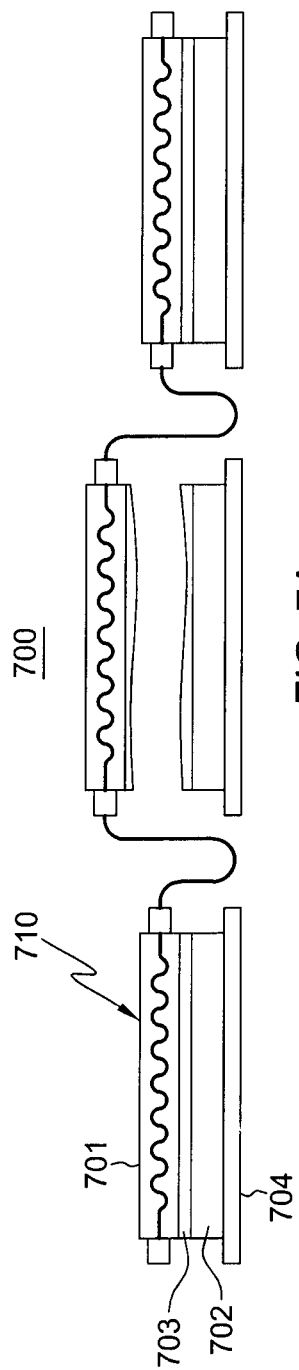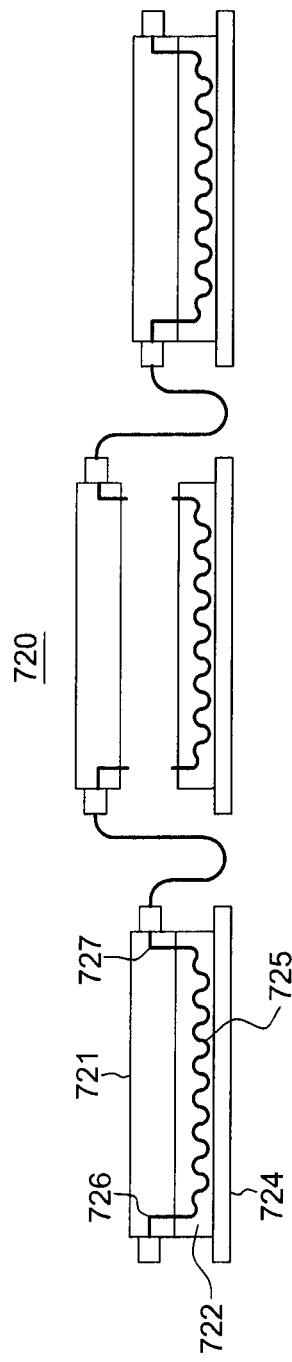

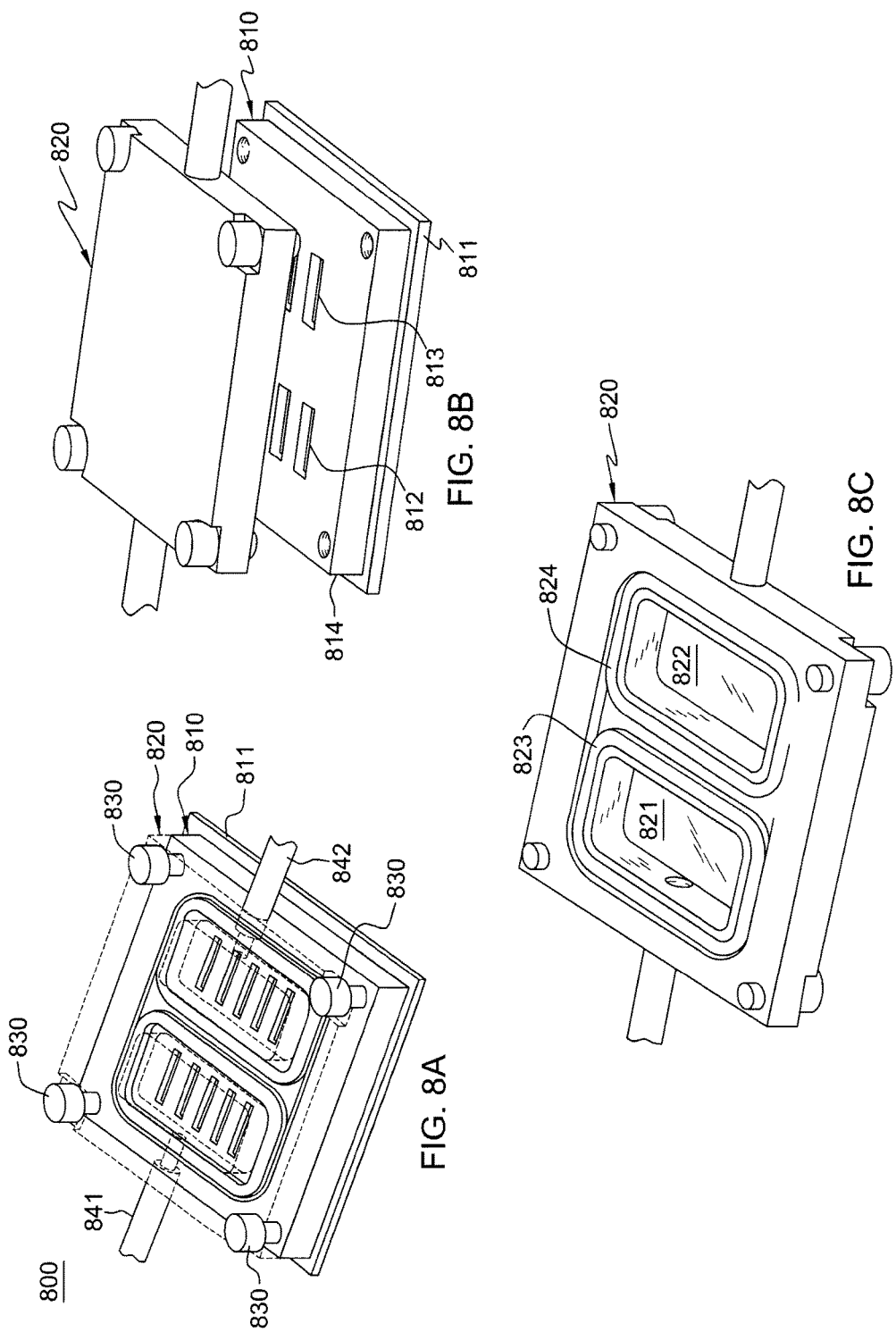

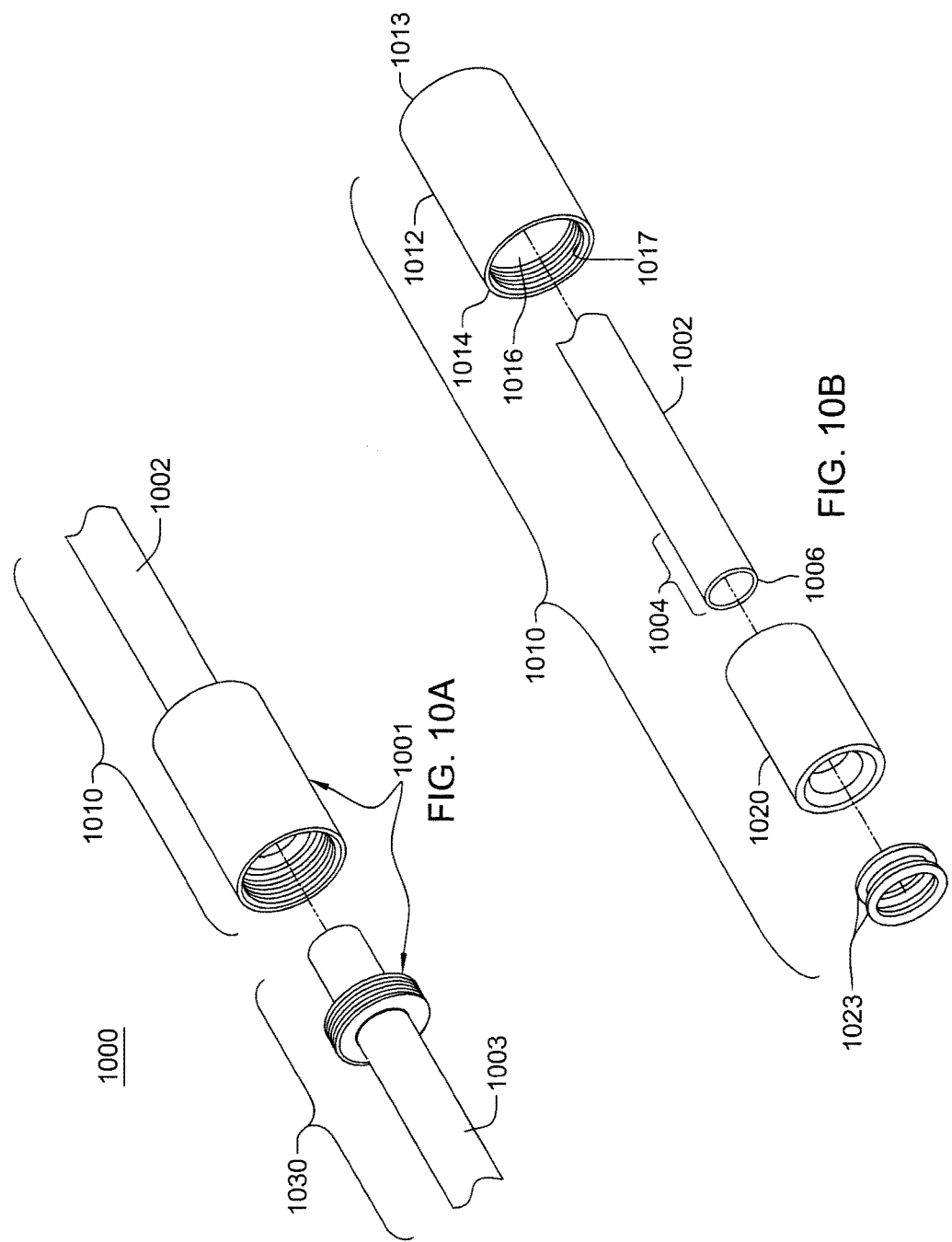

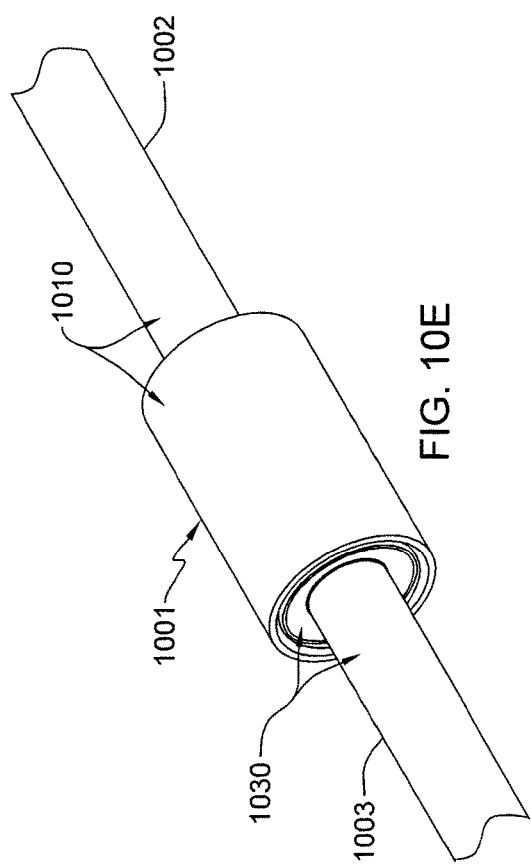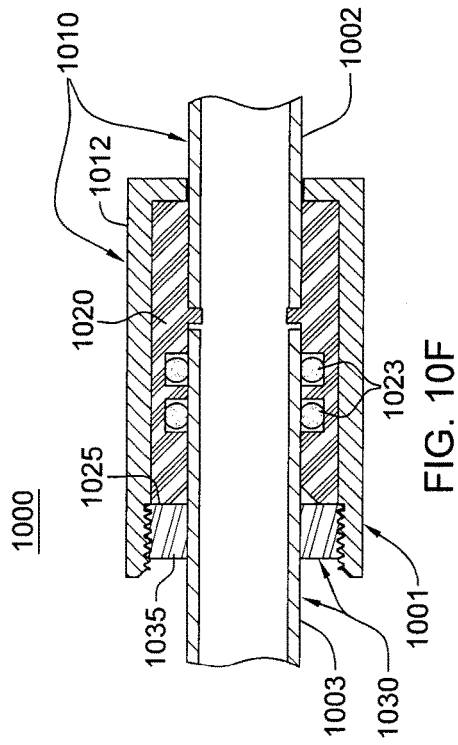
FIG. 10E
FIG. 10F

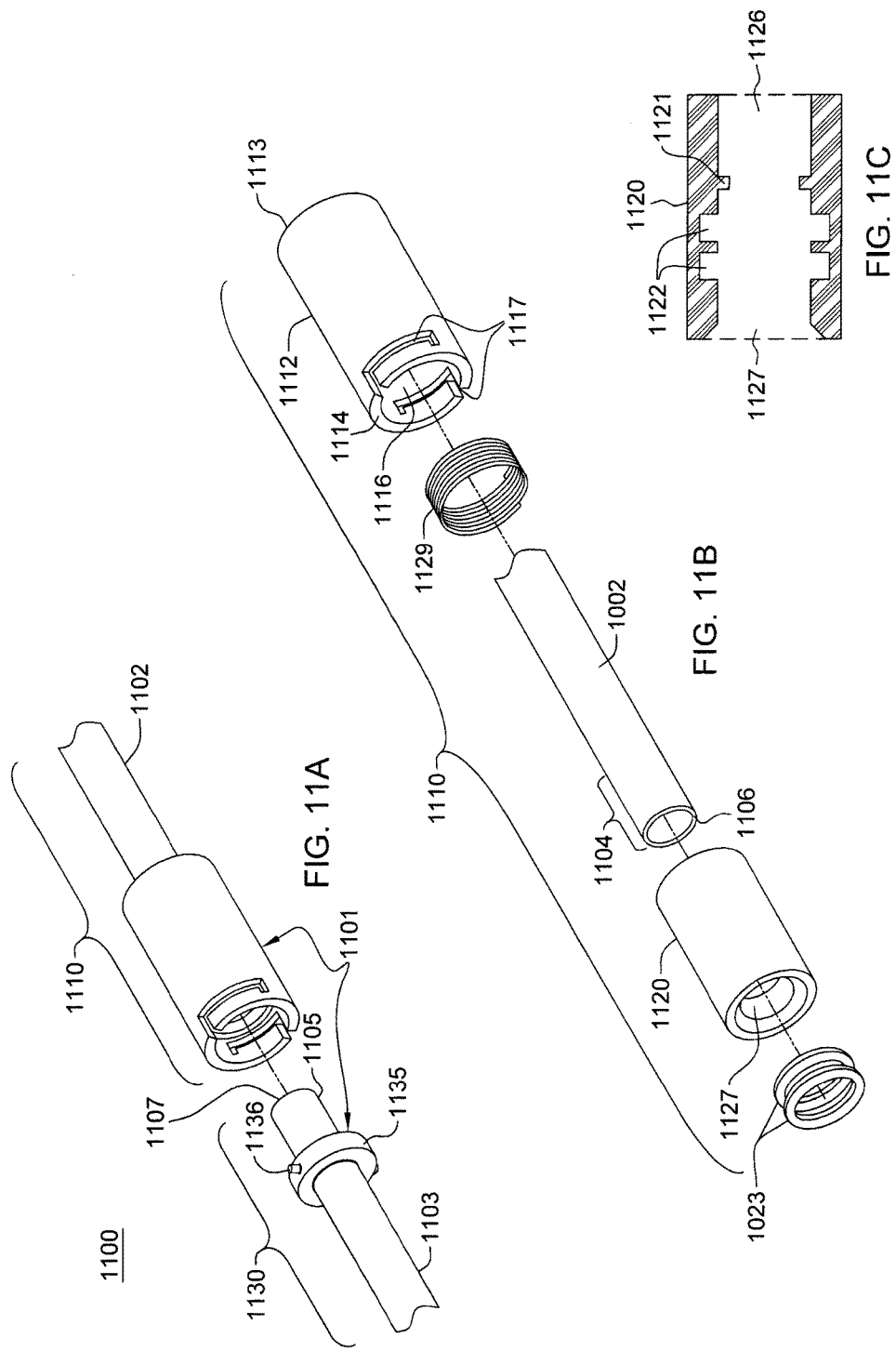

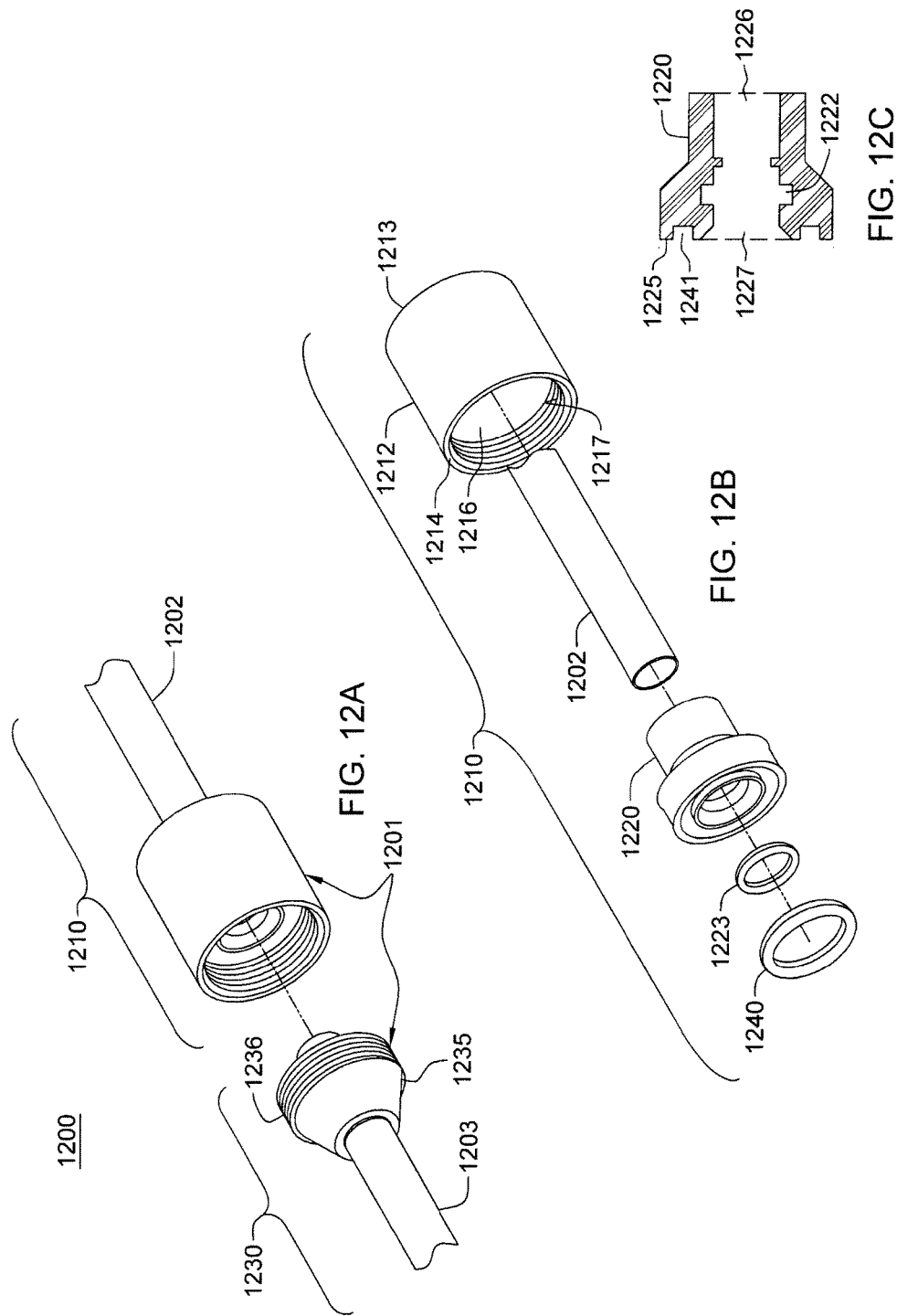

COUPLING ASSEMBLIES FOR CONNECTING FLUID-CARRYING COMPONENTS

BACKGROUND

Connectors for hollow, liquid-carrying conduits or tubes have been realized in a great variety of types and shapes. These connectors include threaded fittings, push-fit connectors, flange and/or hinge-based fittings, as well as barb fittings.

In certain applications, a need exists for enhanced connectors for coupling conduits to other structures, such as other conduits, or to a fitting, manifold, etc. For instance, as disclosed herein, it is believed desirable to provide enhanced connectors for connecting a conduit to a manifold of, for example, a liquid-cooled assembly configured to cool at least one electronic component by facilitating removal of heat generated by the at least one electronic component.

Many conventional connectors pose disadvantages when employed with liquid manifolds, such as the above-noted liquid-cooled assembly.

BRIEF SUMMARY

In one aspect, the shortcomings of the prior art are overcome and additional advantages are provided herein through the provision of an apparatus which includes a coupling assembly to connect fluid-carrying components. The coupling assembly includes, for instance: a socket fitting with a first opening and a second opening in fluid communication through the socket fitting, the first opening being sized to accommodate a portion of a first fluid-carrying component therein, and the second opening being sized to accommodate a portion of a second fluid-carrying component therein; a sleeve, the sleeve enclosing the socket fitting at least in part and being rotatable relative to the socket fitting, the sleeve including a first locking feature; and a second locking feature associated with one fluid-carrying component of the first and second fluid-carrying components, the second locking feature being positioned and sized to engage the first locking feature when the one fluid-carrying component is inserted into a respective opening of the first and second openings in the socket fitting, and wherein, when engaged, rotating of the sleeve facilitates locking the first and second locking features together to secure to one fluid-carrying component to the socket fitting.

In another aspect, an apparatus is provided which includes one fluid-carrying component, and a coupling assembly to connect the one fluid-carrying component to another fluid-carrying component. The coupling assembly includes, for instance: a socket fitting secured to the another coolant-carrying component and comprising an opening in fluid communication through the socket fitting with the another fluid-carrying component, the opening being sized to accommodate a portion of the one fluid-carrying component therein; a sleeve, the sleeve encircling the socket fitting at least in part and being rotatable relative to the socket fitting, the sleeve comprising a first locking feature; and a second locking feature associated with the one fluid-carrying component, the second locking feature being positioned and sized to engage the first locking feature when the one fluid-carrying component is inserted into the opening within the socket fitting, and wherein, once engaged, rotating of the sleeve facilitates locking the first and second locking features together to secure the one fluid-carrying component to the socket fitting.

In a further aspect, a method is provided which includes: providing a coupling assembly to connect fluid-carrying components. The providing of the coupling assembly includes, for instance: providing a socket fitting with a first opening and a second opening in fluid communication through the socket fitting, the first opening being sized to accommodate a portion of a first fluid-carrying component therein, and the second opening being sized to accommodate a portion of a second fluid-carrying component therein; providing a sleeve, the sleeve encircling the socket fitting at least in part, and being rotatable relative to the socket fitting, the sleeve comprising a first locking feature; and providing a second locking feature associated with one fluid-carrying component of the first and second fluid-carrying components, the second locking feature being positioned and sized to engage the first locking feature when the one fluid-carrying component is inserted into a respective opening of the first and second openings in the socket fitting, and wherein, once engaged, rotating of the sleeve facilitates locking the first and second locking features together to secure the one fluid-carrying component to the socket fitting.

Additional features and advantages are realized through the techniques of the present invention. Other embodiments and aspects of the invention are described in detail herein and are considered a part of the claimed invention.

BRIEF DESCRIPTION OF THE DRAWINGS

One or more aspects are particularly pointed out and distinctly claimed as examples in the claims at the conclusion of the specification. The foregoing and objects, features, and advantages of one or more aspects of the invention are apparent from the following detailed description taken in conjunction with the accompanying drawings in which:

FIG. 7A is a schematic of one embodiment of a cooled electronic system comprising multiple cooled electronic assemblies with multiple cold plates coupled via a thermal interface material to multiple electronic modules, wherein one cold plate is shown being detached from its electronic module for, for example, servicing or replacement of the electronic module, and wherein one or more coupling assemblies may be employed in association with the multiple cold plates, in accordance with one or more aspects of the present invention;

FIG. 7B is a schematic of an alternate embodiment of a cooled electronic system comprising multiple electronic assemblies with multiple coolant-cooled electronic modules and multiple coolant manifold structures detachably coupled thereto, within which one or more coupling assemblies may be employed, in accordance with one or more aspects of the present invention;

FIG. 8A depicts another embodiment of a cooled electronic assembly comprising a coolant-cooled electronic module and a liquid manifold, within which one or more coupling assemblies may be employed, in accordance with one or more aspects of the present invention;

FIG. 8B depicts the cooled electronic assembly of FIG. 8A, with the liquid manifold and coolant-cooled electronic module shown detached, in accordance with one or more aspects of the present invention;

FIG. 8C depicts an interface surface of the liquid manifold of FIGS. 8A & 8B, configured to couple to the coolant-cooled electronic module, in accordance with one or more aspects of the present invention;

FIG. 10A depicts one embodiment of an apparatus comprising a coupling assembly to connect first and second fluid-carrying components, where a socket-side assembly and a plug-side assembly of the apparatus are shown disconnected, in accordance with one or more aspects of the present invention;

FIG. 10B is an exploded view of the socket-side assembly of FIG. 10A, in accordance with one or more aspects of the present invention;

FIG. 10E depicts the apparatus of FIG. 10A, with the plug-side and socket-side assemblies shown connected, in accordance with one or more aspects of the present invention;

FIG. 10F is a cross-sectional elevational illustration of the connected apparatus of FIG. 10E, in accordance with one or more aspects of the present invention;

FIG. 11A depicts an alternate embodiment of an apparatus comprising a coupling assembly to connect first and second fluid-carrying components, where a socket-side assembly and a plug-side assembly of the apparatus are shown disconnected, in accordance with one or more aspects of the present invention;

FIG. 11B is an exploded depiction of the socket-side assembly of FIG. 11A, in accordance with one or more aspects of the present invention;

FIG. 11C is a cross-sectional elevational depiction of the socket fitting of the socket-side assembly of FIG. 11A, in accordance with one or more aspects of the present invention;

FIG. 12A depicts another embodiment of an apparatus comprising a coupling assembly to connect first and second fluid-carrying components, where a socket-side assembly and a plug-side assembly of the apparatus are shown disconnected, in accordance with one or more aspects of the present invention;

FIG. 12B is an exploded view of the socket-side assembly of FIG. 12A, in accordance with one or more aspects of the present invention;

FIG. 12C is a cross-sectional elevational view of the socket fitting of the socket-side assembly of FIG. 12A, in accordance with one or more aspects of the present invention;

DETAILED DESCRIPTION

Disclosed herein are coupling assemblies or couplers for facilitating releasable, fluid-tight connecting of first and second fluid-carrying components. The first and second fluid-carrying components may be a variety of structures, such as conduits, tubes, fittings, manifolds, etc. In one or more implementations, the coupling assembly may be employed to connect a conduit (or tube) to, for instance, a liquid manifold or liquid-manifold assembly of a cooling apparatus. For instance, one or more features of the coupling assemblies disclosed herein may be integrated with a variety of liquid manifolds. By way of example only, various liquid manifolds are described below with reference to FIGS. 1-9C, where the liquid manifold may be, for example, part of a cooling apparatus, such as part of a coolant-cooled electronic module, or be detachably coupled to a coolant-cooled electronic module, to facilitate flow of liquid coolant through the module and removal of heat generated within the module. Those skilled in the art will understand, however, that the coupling assemblies disclosed may be, in part, integrated with various types of housings, for instance, at either an inlet or an outlet of the housing. Advantageously, the connectors disclosed hereinbelow with reference to FIGS. 10A-12E may be used to releasably secure a wide variety of fluid-carrying components together.

Reference is made below to the drawings, which may not be drawn to scale to facilitate an understanding of the invention, wherein the same reference numbers used throughout different figures designate the same or similar components.

Figure 1:
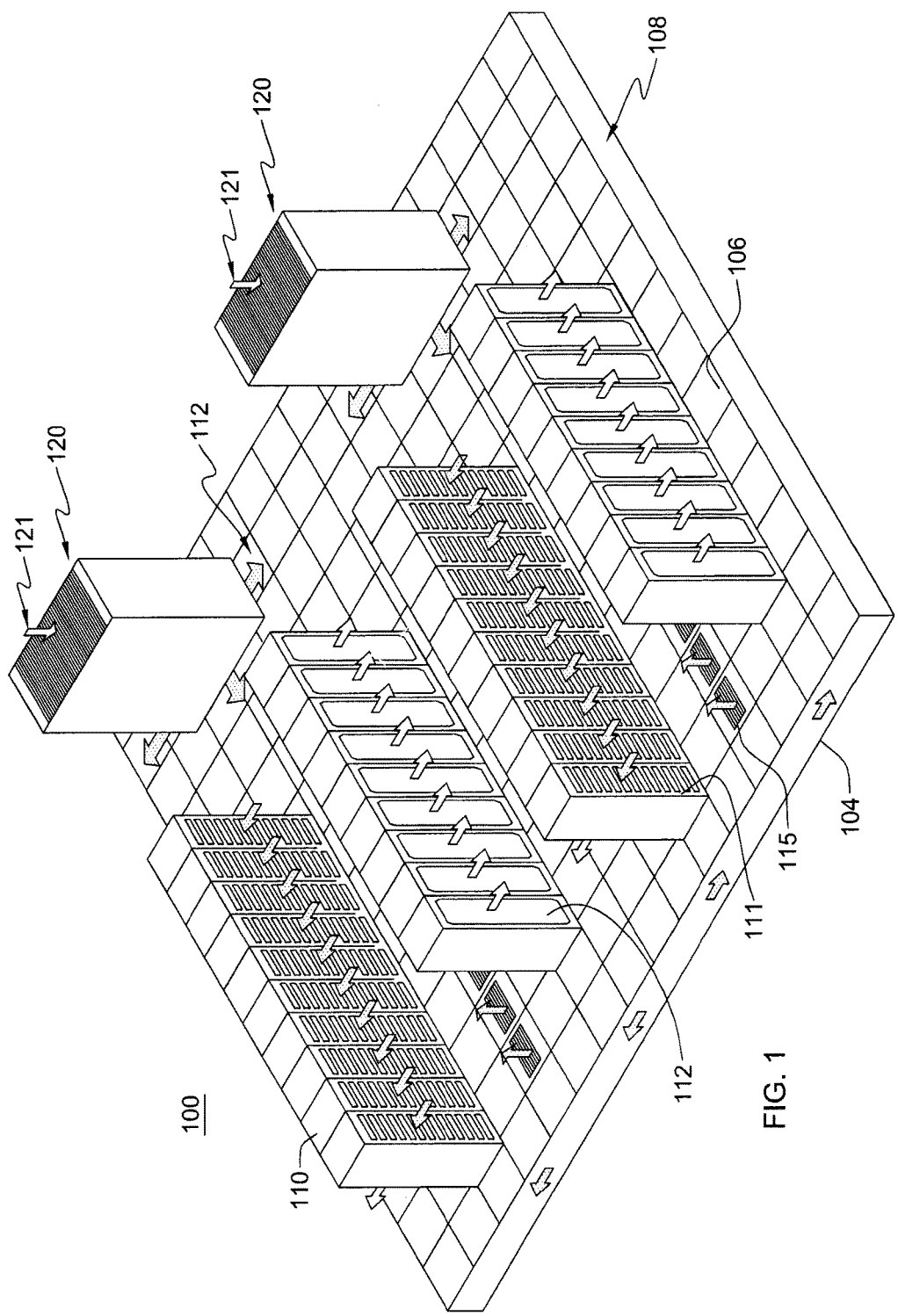
FIG. 1 depicts one embodiment of a raised floor layout of an air-cooled data center.

By way of example, one embodiment of an air cool data center 100 is depicted in FIG. 1. As shown, in a raised floor layout of air-cooled data center 100, multiple electronics racks 110 may be disposed in one or more rows. A computer installation such as depicted may house several hundred, or even several thousand processors. In the arrangement of FIG. 1, chilled air enters the computer room via floor vents from a supply air plenum 108 defined between a raised floor 106 and a base or sub-floor 104 of the room. Cooled air is taken in through the front or air inlet sides 111 of the electronics racks and expelled through the back, or air outlet sides 112, of the electronics racks. Each electronics rack 110 may have one or more air-moving devices (e.g., axial or centrifugal fans) to provide forced inlet-to-outlet airflow to cool the electronic components within the rack. Supply air plenum 108 provides conditioned and cooled air to the air-inlet sides of the electronics racks via perforated floor tiles 115 disposed (in one embodiment) in a "cold" air aisle of the data center. The conditioned and cooled air is supplied to plenum 108 by one or more air-conditioning units 120, which may also be disposed within data center 100. Room air 121 is taken into each air-conditioning unit 150 near an upper portion thereof. In the depicted embodiment, this room air comprises in part exhausted air from the "hot" air aisles of the data center defined by opposing air outlet sides 112 of electronics racks 110.

Due to the ever-increasing airflow requirements through electronics racks, and the limits of air distribution within the typical data center installation, coolant-assisted cooling is being combined with conventional air-cooling. FIGS. 2-6 illustrate one embodiment of a data center implementation employing a coolant-assisted cooling system with one or more cold plates coupled to high heat-generating electronic components disposed within the electronics racks.

Figure 2:
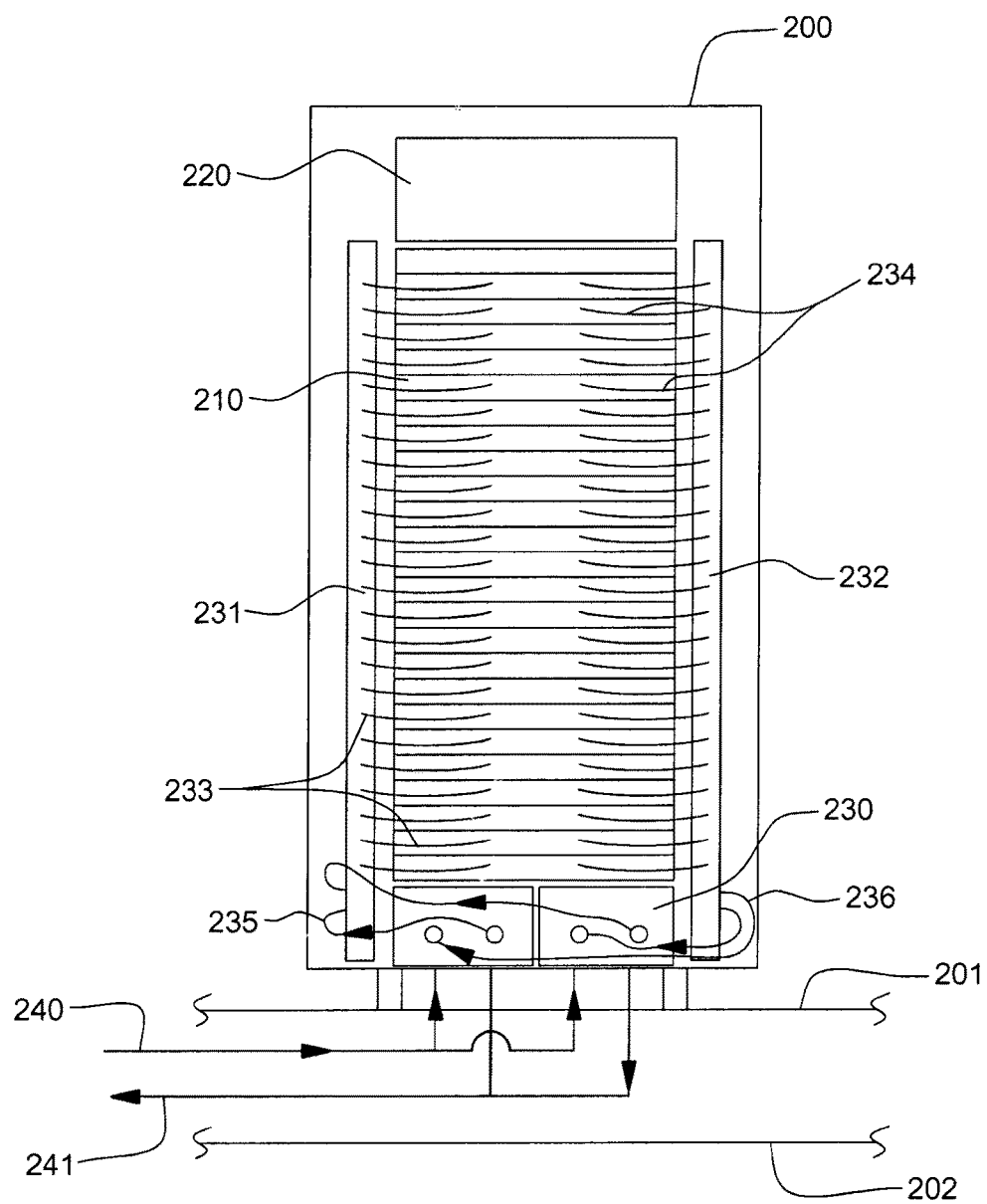
FIG. 2 is a front elevational view of one embodiment of an at least partially coolant-cooled electronics rack comprising multiple electronic subsystems and a cooling apparatus to use one or more coupling assemblies, in accordance with one or more aspects of the present invention.

FIG. 2 depicts one embodiment of a partially coolant-cooled electronics rack 200. As illustrated, coolant-cooled electronics rack 200 comprises a plurality of electronic subsystems 210, which may be processor or server nodes. A bulk power regulator 220 is shown disposed at an upper portion of liquid-cooled electronics rack 200, and two coolant conditioning units (CCUs) 230 are disposed in a lower portion of the liquid-cooled electronics rack. In certain embodiments described below, the coolant is assumed to be water or an aqueous-based solution (by way of example only).

In addition to CCUs 230, the cooling system includes a system water supply manifold 231, a system water return manifold 232, and manifold-to-node fluid connect hoses 233 coupling system water supply manifold 231 to electronic subsystems 210, and node-to-manifold fluid connect hoses 234 coupling the individual electronic subsystems 210 to system water return manifold 232. Each CCU 230 is in fluid communication with system water supply manifold 231 via a respective system water supply hose 235, and each CCU 230 is in fluid communication with system water return manifold 232 via a respective system water return hose 236.

As illustrated, a portion of the heat load of the electronic subsystems is transferred from the system water to cooler facility water supplied by facility water supply line 240 and facility water return line 241 disposed, in the illustrated embodiment, in the space between a raised floor 201 and a base floor 202.

Figure 3:
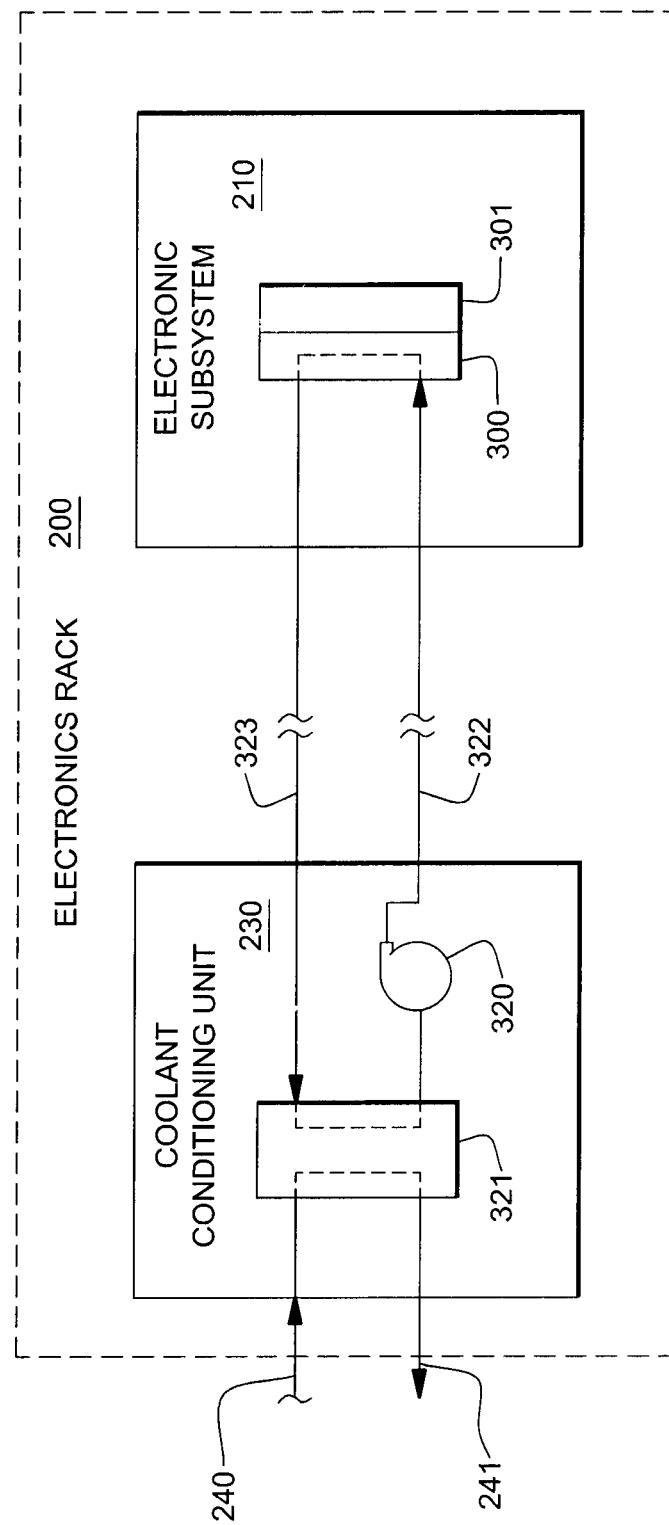
FIG. 3 is a schematic of one embodiment of an electronics rack, wherein an electronic module (or component) is coolant-cooled by system coolant (provided by one or more coolant conditioning units disposed within the electronics rack) passing through a coolant-cooled structure coupled to the electronic module, and within which one or more coupling assemblies may be employed, in accordance with one or more aspects of the present invention.

FIG. 3 schematically illustrates operation of the cooling system of FIG. 2, wherein a liquid-cooled cold plate 300 is shown coupled to an electronic module 301 of an electronic subsystem 210 within the liquid-cooled electronics rack 200. Heat is removed from electronic module 301 via system coolant circulated via pump 320 through cold plate 300 within the system coolant loop defined by liquid-to-liquid heat exchanger 321 of coolant conditioning unit 230, lines 322, 323 and cold plate 300. The system coolant loop and coolant conditioning unit are designed to provide coolant of a controlled temperature and pressure, as well as controlled chemistry and cleanliness to the electronic module(s). Furthermore, the system coolant is physically separate from the less controlled facility coolant in lines 240, 241, to which heat is ultimately transferred.

Figure 4:
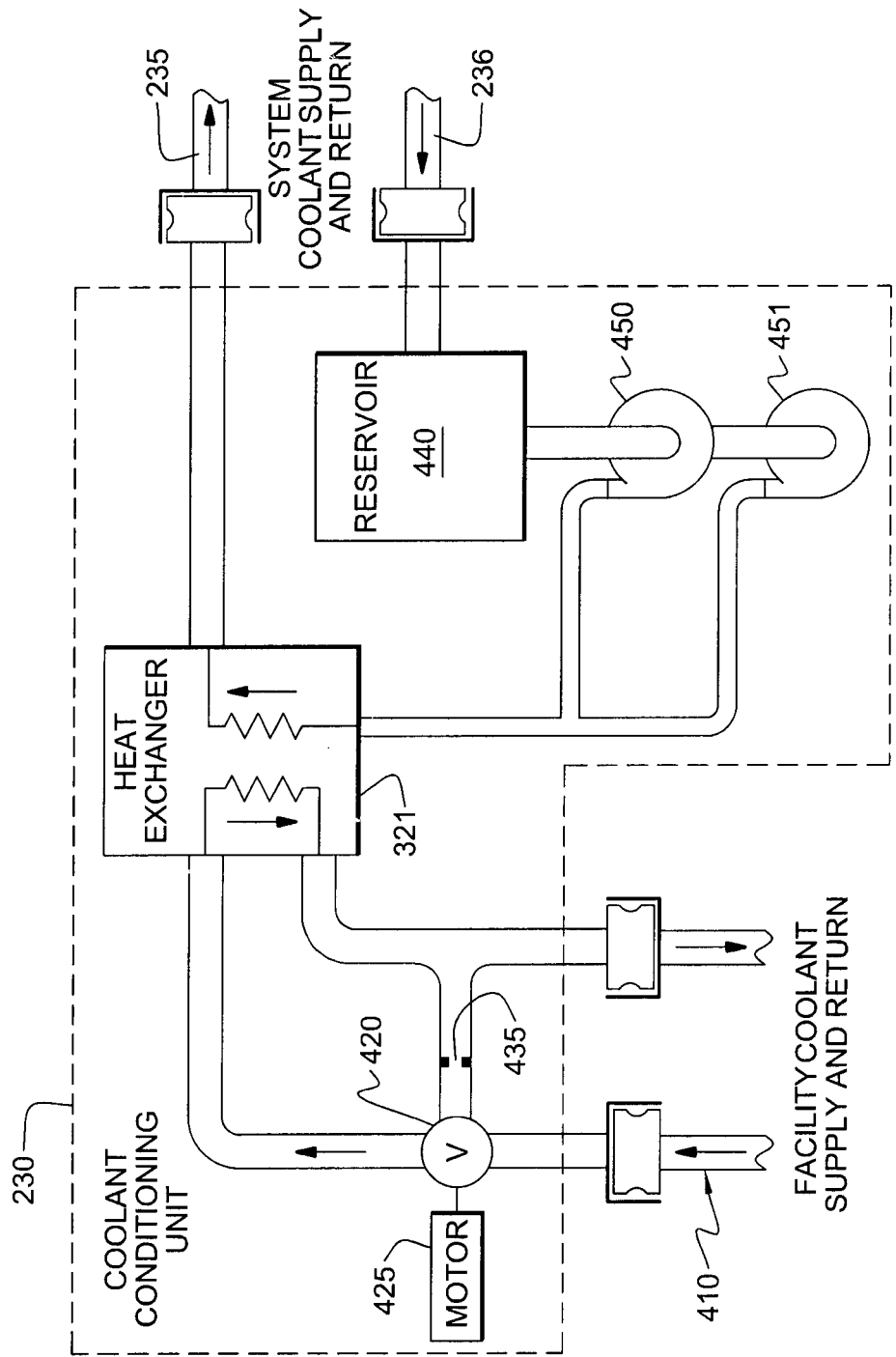
FIG. 4 is a schematic of one embodiment of a coolant conditioning unit disposed within a coolant-cooled electronics rack such as depicted in FIGS. 2 & 3, in accordance with one or more aspects of the present invention.

FIG. 4 depicts a more detailed embodiment of a coolant conditioning unit 230. As shown in FIG. 4, coolant conditioning unit 230 includes a first coolant loop wherein chilled, facility coolant is supplied 410 and passes through a control valve 420 driven by a motor 425. Valve 420 determines an amount of facility coolant to be passed through heat exchanger 321, with a portion of the facility coolant possibly being returned directly via a bypass orifice 435. The coolant conditioning unit further includes a second coolant loop with a reservoir tank 440 from which system coolant is pumped, either by pump 450 or pump 451, into the heat exchanger 321 for conditioning and output thereof, as cooled system coolant to the electronics rack to be cooled. The cooled system coolant is supplied to the system water supply manifold and returned from the system water return manifold of the liquid-cooled electronics rack via the system water supply hose 235 and system water return hose 236, respectively.

Figure 5:
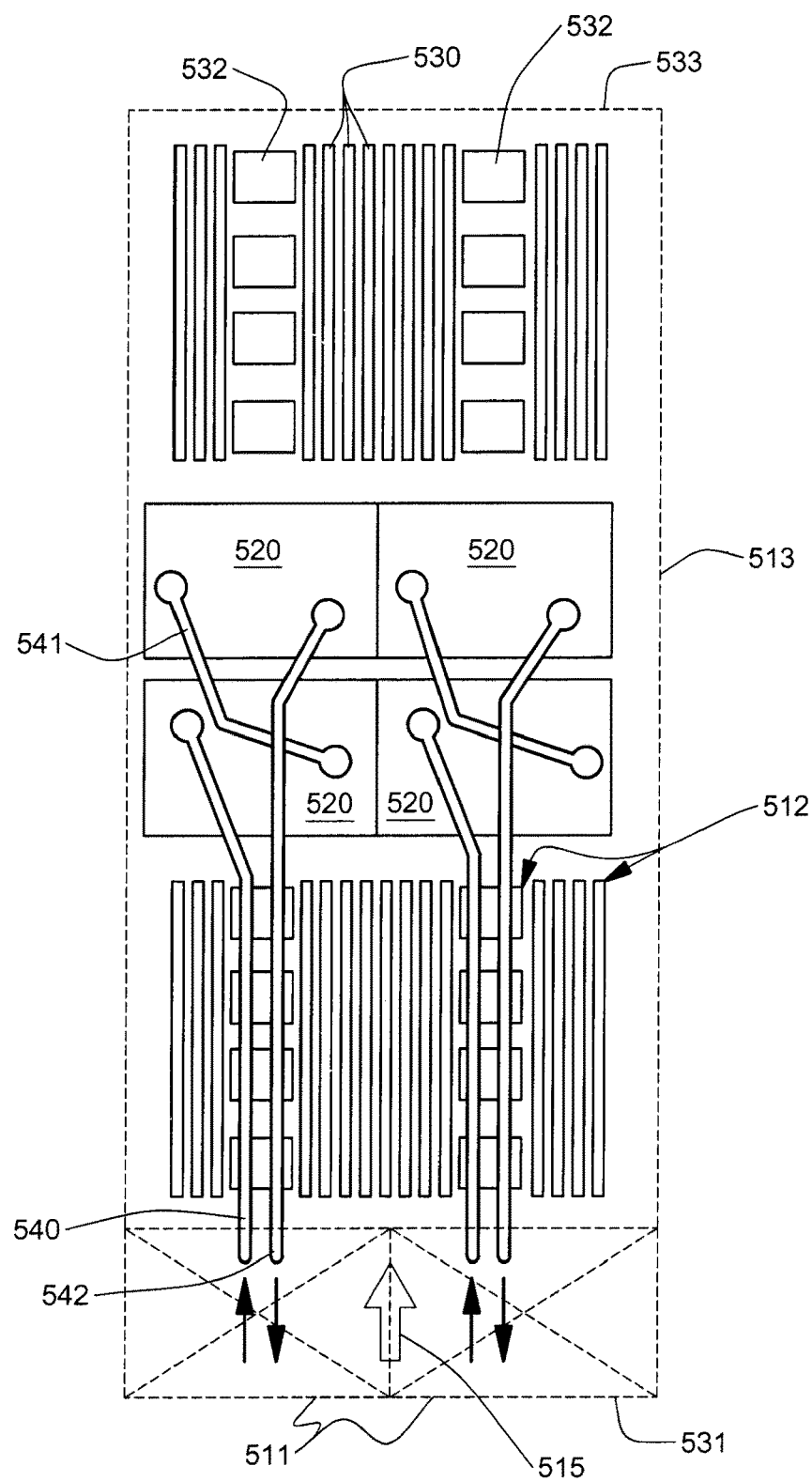
FIG. 5 is a plan view of one embodiment of an electronic subsystem layout illustrating a hybrid cooling system for cooling components of the electronic subsystem, and which may employ one or more coupling assemblies, in accordance with one or more aspects of the present invention.

FIG. 5 depicts one embodiment of an electronic subsystem 513 component layout wherein one or more air moving devices 511 provide forced air flow 515 to cool multiple components 512 within electronic subsystem 513. Cool air is taken in through a front 531 and exhausted out a back 533 of the drawer. The multiple components to be cooled include multiple processor modules to which liquid-cooled cold plates 520 (of a liquid-based cooling system) are coupled, as well as multiple arrays of memory modules 530 (e.g., dual in-line memory modules (DIMMs)) and multiple rows of memory support modules 532 (e.g., DIMM control modules) to which air-cooled heat sinks are coupled. In the embodiment illustrated, memory modules 530 and the memory support modules 532 are partially arrayed near front 531 of electronic subsystem 513, and partially arrayed near back 533 of electronic subsystem 513. Also, in the embodiment of FIG. 5, memory modules 530 and the memory support modules 532 are cooled by air flow 515 across the electronic subsystem.

The illustrated coolant-based cooling system further includes multiple coolant-carrying tubes connected to and in fluid communication with coolant-cooled cold plates 520. The coolant-carrying tubes comprise sets of coolant-carrying tubes, with each set including (for example) a coolant supply tube 540, a bridge tube 541 and a coolant return tube 542. In this example, each set of tubes provides coolant to a series-connected pair of cold plates 520 (coupled to a pair of processor modules). Coolant flows into a first cold plate of each pair via the coolant supply tube 540 and from the first cold plate to a second cold plate of the pair via bridge tube or line 541, which may or may not be thermally conductive. From the second cold plate of the pair, coolant is returned through the respective coolant return tube 542.

Figure 6:
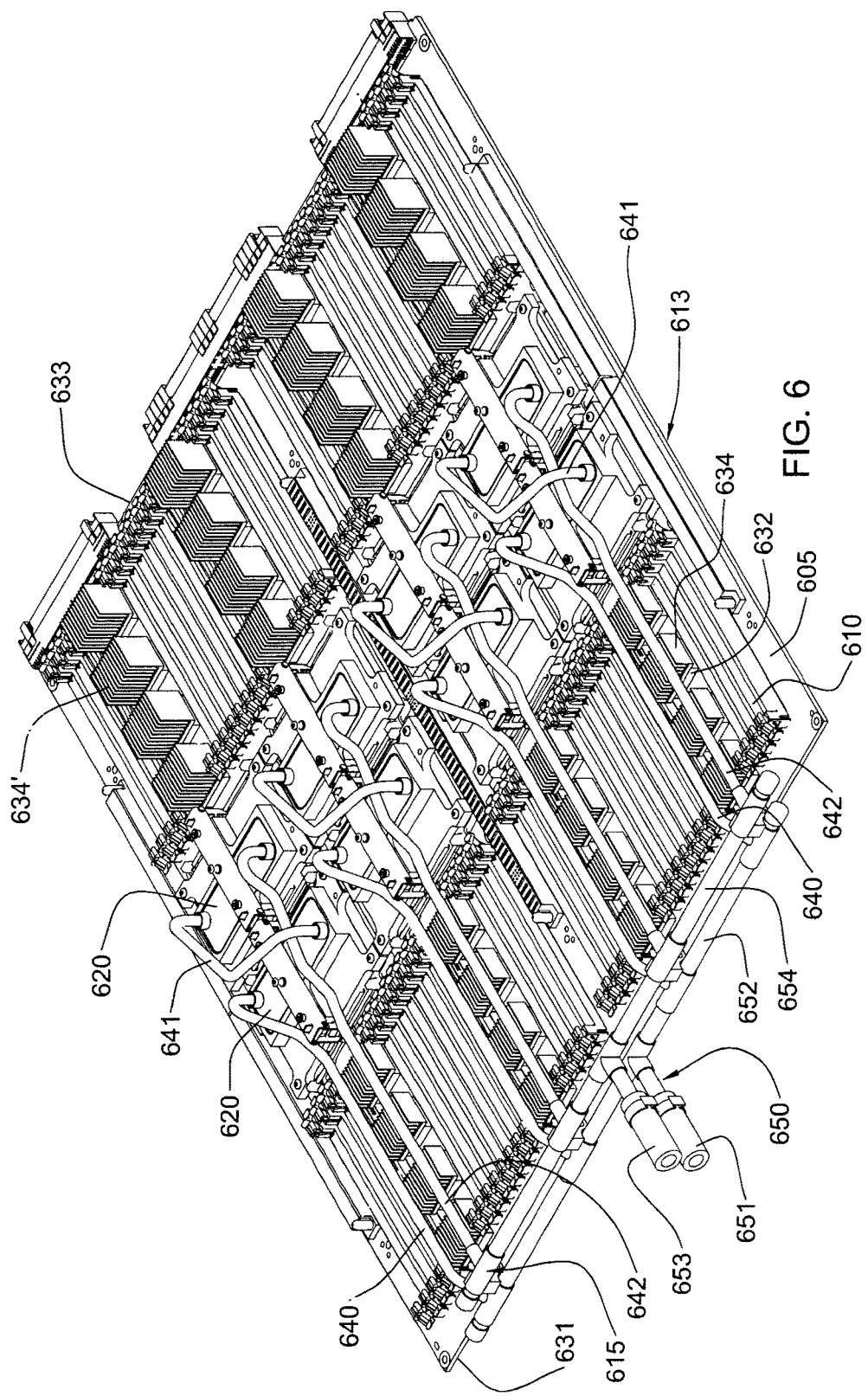
FIG. 6 depicts one detailed embodiment of a partially-assembled electronic subsystem layout, wherein the electronic subsystem includes, by way of example, eight heat-generating electronic components to be actively cooled, each having a respective coolant-cooled structure of a coolant-based cooling system coupled thereto and within which one or more coupling assemblies may be employed, in accordance with one or more aspects of the present invention.

FIG. 6 depicts in greater detail an alternate electronics drawer layout comprising eight processor modules, each having a respective coolant-cooled cold plate of a coolant-based cooling system coupled thereto. The coolant-based cooling system is shown to further include associated coolant-carrying tubes for facilitating passage of liquid coolant through the coolant-cooled cold plates and a header subassembly to facilitate distribution of coolant to and return of coolant from the coolant-cooled cold plates. By way of specific example, the coolant passing through the coolant-based cooling subsystem is chilled water.

The depicted planar server assembly includes a multi-layer printed circuit board to which memory DIMM sockets and various electronic components to be cooled are attached both physically and electrically. In the cooling system depicted, a supply header is provided to distribute coolant from a single inlet to multiple parallel coolant flow paths and a return header collects exhausted coolant from the multiple parallel coolant flow paths into a single outlet. Each parallel coolant flow path includes one or more cold plates in series flow arrangement to cool one or more electronic components to which the cold plates are mechanically and thermally coupled. The number of parallel paths and the number of series-connected coolant-cooled cold plates depends, for example, on the desired device temperature, available coolant temperature and coolant flow rate, and the total heat load being dissipated from each electronic component.

More particularly, FIG. 6 depicts a partially assembled electronic system 613 and an assembled coolant-based cooling system 615 coupled to primary heat-generating components (e.g., including processor dies) to be cooled. In this embodiment, the electronics system is configured for (or as) an electronics drawer of an electronics rack, and includes, by way of example, a support substrate or planar board 605, a plurality of memory module sockets 610 (with the memory modules (e.g., dual in-line memory modules) not shown), multiple rows of memory support modules 632 (each having coupled thereto an air-cooled heat sink 634), and multiple processor modules (not shown) disposed below the coolant-cooled cold plates 620 of the coolant-based cooling system 615.

In addition to coolant-cooled cold plates 620, coolant-based cooling system 615 includes multiple coolant-carrying tubes, including coolant supply tubes 640 and coolant return tubes 642 in fluid communication with respective coolant-cooled cold plates 620. The coolant-carrying tubes 640, 642 are also connected to a header (or manifold) subassembly 650 which facilitates distribution of coolant to the coolant supply tubes and return of coolant from the coolant return tubes 642. In this embodiment, the air-cooled heat sinks 634 coupled to memory support modules 632 closer to front 631 of electronics drawer 613 are shorter in height than the air-cooled heat sinks 634' coupled to memory support modules 632 near back 633 of electronics drawer 613. This size difference is to accommodate the coolant-carrying tubes 640, 642 since, in this embodiment, the header subassembly 650 is at the front 631 of the electronics drawer and the multiple liquid-cooled cold plates 620 are in the middle of the drawer.

Coolant-based cooling system 615 may comprise a pre-configured structure which includes multiple (pre-assembled) coolant-cooled cold plates 620 configured and disposed in spaced relation to engage respective heat-generating electronic components. Each coolant-cooled cold plate 620 includes, in this embodiment, a coolant inlet and a coolant outlet, as well as an attachment subassembly (i.e., a cold plate/load arm assembly). Each attachment subassembly is employed to couple its respective coolant-cooled cold plate 620 to the associated electronic component to form the cold plate and electronic component assemblies. Alignment openings (i.e., thru-holes) are provided on the sides of the cold plate to receive alignment pins or positioning dowels during the assembly process. Additionally, connectors (or guide pins) are included within the attachment subassembly, which facilitate use of the attachment assembly.

As shown in FIG. 6, header subassembly 650 includes two manifolds, i.e., a coolant supply header 652 and a coolant return header 654, which in one embodiment, are coupled together via supporting brackets. In one approach, the coolant supply header 652 may be metallurgically bonded in fluid communication to each coolant supply tube 640, and the coolant return header 654 may be metallurgically bonded in fluid communication to each coolant return tube 642. In another approach, coupling assemblies such as disclosed herein may be used to connect the illustrated tubes and headers. A single coolant inlet 651 and a single coolant outlet 653 extend from the header subassembly for coupling to the electronics rack's coolant supply and return manifolds (not shown).

FIG. 6 also depicts one embodiment of coolant-carrying tubes. In addition to coolant supply tubes 640 and coolant return tubes 642, bridge tubes or lines 641 may be provided for coupling, for example, a coolant outlet of one coolant-cooled cold plate to the coolant inlet of another coolant-cooled cold plate to connect in series fluid flow the cold plates, with the pair of cold plates receiving and returning coolant via a respective set of coolant supply and return tubes. In one embodiment, the coolant supply tubes 640, bridge tubes 641 and coolant return tubes 642 are each pre-configured, semi-rigid tubes formed of a thermally conductive material, such as copper or aluminum, and the tubes are coupled in a fluid-tight manner to the header subassembly and/or the liquid-cooled cold plates. The tubes are pre-configured for a particular electronics system to facilitate installation of the monolithic structure in engaging relation with the electronics system.

The above-described cooling approaches of FIGS. 2-6 present effective solutions for circulating water through coolant-cooled cold plates attached to heat-generating circuit modules (or components). An example of the efficacy of this approach is the IBM Power 575' system offered by International Business Machines Corporation, Armonk, N.Y. In the embodiment of FIGS. 2-6, one or more coolant conditioning units containing a pump and, for example, a water-to-water heat exchanger, may be disposed within each electronics rack. As explained above, heat load carried by the system coolant circulating through the coolant-cooled components in the coolant-cooled electronics rack is rejected to facility chilled water passing through the second coolant path through the active water-to-water heat exchangers within the coolant conditioning units disposed within the rack units.

Field-replaceability of cooling system components can be facilitated by providing cooling subassemblies that employ, for example, flexible or semi-flexible tubing interconnecting the coolant-cooled cold plates. One approach to such a subassembly 700 is depicted in FIG. 7A, wherein multiple cooled electronic assemblies 710 are depicted interconnected in fluid communication. In this approach, flexibility in the interconnect tubing allows for a particular coolant-cooled cold plate 701 to be decoupled at its interface with an electronic module 702 resident on, in this example, a substrate 704. Decoupling is facilitated by providing a thermal interface material 703, which allows for subsequent reworking of the cooled electronic assembly 710. By way of example, commonly assigned U.S. Pat. No. 7,420,808 B2, depicts cooling subassemblies which comprise multiple cooled electronic assemblies, such as schematically depicted in FIG. 7A.

FIG. 7B is a schematic of an alternate a cooling approach, wherein a coolant-cooled electronic subsystem 720 is illustrated comprising a coolant manifold structure 721 detachably coupled to a coolant-cooled electronic module 722. In the depicted embodiment, one or more coolant-carrying channels 725 are integrated within the coolant-cooled electronic module (or integrated electronic module) 722, so as to reside within the electronic module, for example, within an encapsulation of the module, or within a module lid enclosing one or more electronic components within the module. By way of example, the coolant-cooled electronic module is illustrated on a substrate 724. In the depicted embodiment, the coolant manifold structure 721 includes a coolant inlet 726 (which may comprise a coolant inlet manifold) and a coolant outlet 727 (which may comprise a coolant outlet manifold). Coolant inlet 726 and coolant outlet 727 are configured and disposed to be in fluid communication with the one or more coolant-carrying channels 725 of coolant-cooled electronic module 722 when the coolant manifold structure 721 is detachably coupled to the electronic module.

FIGS. 8A-8C illustrate an additional embodiment of a cooled electronic assembly, in accordance with one or more aspects of the present invention. In this embodiment, one or more coolant-carrying channels are again integrated within the electronic module itself, for example, within a liquid manifold configured as a module lid (or within an encapsulant) in direct contact with one or more electronic components (such as one or more integrated circuit die or chips), or may be formed integral with the electronic component(s) so as to be disposed within the resultant module.

Referring collectively to FIGS. 8A-8C, cooled electronic assembly 800 is shown to include a coolant-cooled electronic module 810, residing on a substrate 811, and a coolant manifold structure 820 detachably coupled to coolant-cooled electronic module 810 via, for example, multiple fasteners 830 at the corners of the electronic assembly 800. Coolant-cooled electronic module 810 comprises one or more electronic components within the module, as well as one or more coolant-carrying channels, with multiple channels being employed in the embodiment of FIGS. 8A-8C. The multiple channels have multiple heat exchanger inlets 812 and outlets 813 formed within module lid 814 of the coolant-cooled electronic module 810. Detachable coolant manifold structure 820 comprises, in this example, a coolant inlet 821 and a coolant outlet 822, which are designed (in one embodiment) as a coolant inlet manifold and coolant outlet manifold, respectively. The coolant inlet and coolant outlet of the manifold are configured and positioned to align over the coolant inlets 812 and outlets 813 of the heat exchanger within the coolant-cooled electronic module 810. Inner containment rings (or O-rings) 823, 824, may be provided within coolant manifold structure 820 to facilitate a fluid-tight coupling of the coolant manifold structure 820 to the integrated electronic module 810 at the interface between the manifold structure and module. Tubing 841, 842 couples to the coolant manifold structure 820 in fluid communication with the coolant inlet manifold and coolant outlet manifold to facilitate the flow of coolant through the coolant-carrying channels of the coolant-cooled electronic module 810.

Field replaceability of a cooled electronic assembly, or more particularly, the coolant-cooled electronic module of such an assembly, provides significant cost savings and convenience advantages compared with, for example, shutting an electronic subsystem down, and returning the subsystem to a manufacturer for replacement of a module. There are multiple approaches to field replaceability of an assembly or a coolant-cooled electronic module such as described herein. An example is described below with reference to FIGS. 9A & 9B.

Figure 9A:
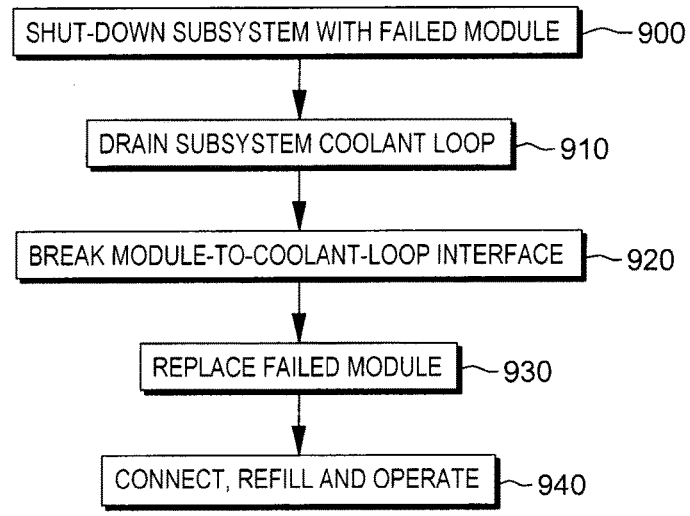
FIG. 9A depicts one embodiment of a process for decoupling a coolant-cooled electronic module and a liquid manifold of a cooled electronic assembly within a coolant-cooled electronic subsystem, in accordance with one or more aspects of the present invention.
Figure 9B:
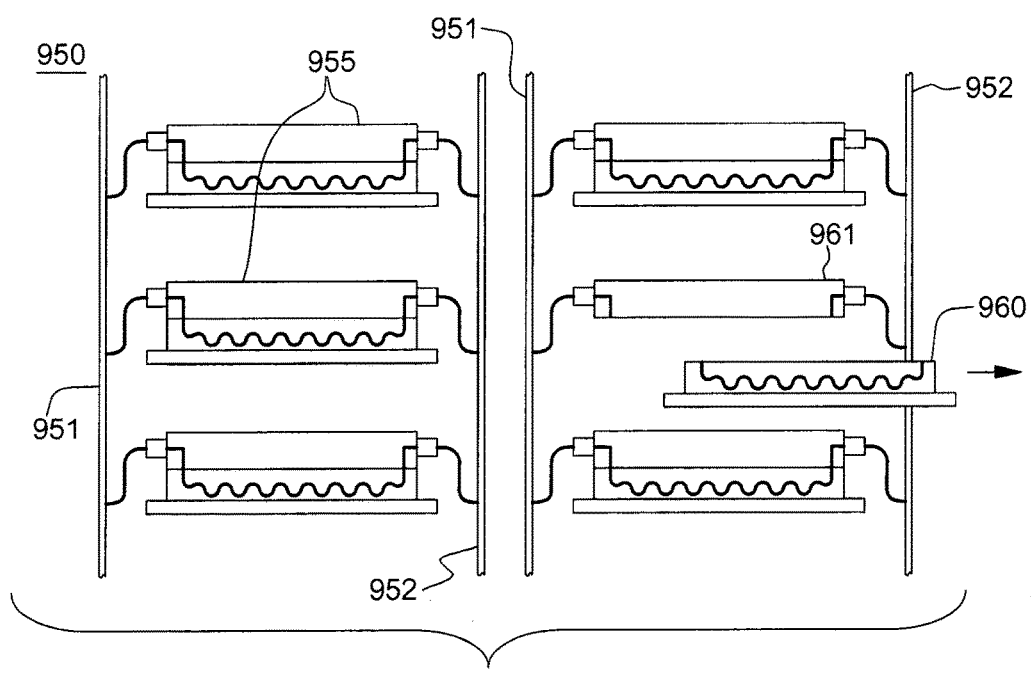
FIG. 9B illustrates decoupling of a coolant-cooled electronic module from a liquid manifold, for example, pursuant to the process of FIG. 9A, in accordance with one or more aspects of the present invention.

FIGS. 9A & 9B illustrate one approach to field replaceability in a cooled electronic system where there are no fluid-valves coupling the coolant manifold structures to the subsystem coolant loop. By way of example, such a system may employ rigid or semi-rigid tubing coupling the coolant manifold structures in substantially fixed positions within the electronic system. This is illustrated in FIG. 9B, where multiple cooled electronic assemblies 955 are shown in position in fluid communication with a subsystem-level coolant inlet manifold 951 and a subsystem-level coolant outlet manifold 952 (by way of example only). As illustrated in this figure, one coolant-cooled electronic module 960 being decoupled (for example, for field-replacing thereof) from its associated coolant manifold structure 961.

Referring to the exchange process of FIG. 9A, a coolant-cooled electronic module may be replaced by shutting down the subsystem (or board) with the electronic module to be replaced 900, and draining the tubing of the subsystem (or board) coolant loop 910. Optionally, the tubing of the subsystem coolant loop may be flushed with air to remove the coolant. Thereafter, the module-to-coolant loop interface may be broken 920 by detaching the coolant-cooled electronic module from its associated coolant manifold structure (see FIG. 9B). The detached coolant-cooled electronic module may then be replaced 930. By draining the subsystem coolant loop prior to decoupling the coolant-cooled electronic module from its coolant manifold structure, discharge of coolant onto, for example, the associated electronic board or other components of the electronic system or subsystem is reduced, or even eliminated. A new coolant-cooled electronic module may then be connected to the coolant manifold structure remaining coupled within the cooled electronic subsystem, after which the subsystem coolant loop is refilled to allow for operation of the cooled electronic system 940.

Figure 9C:
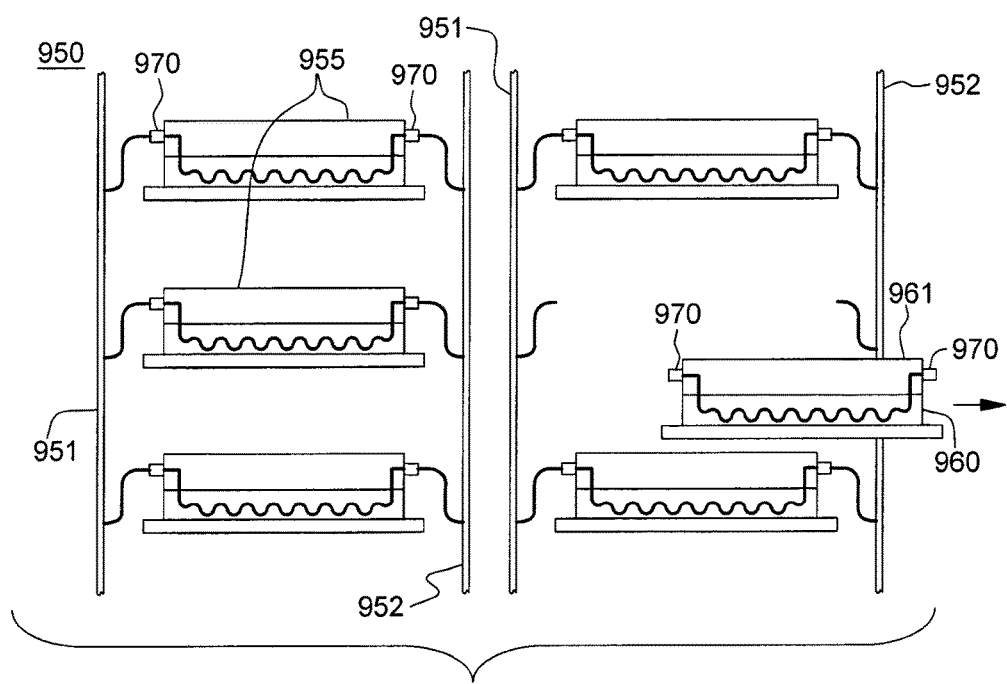
FIG. 9C illustrates decoupling of a cooled electronic assembly from a coolant-cooled electronic subsystem using one or more coupling assemblies, in accordance with one or more aspects of the present invention.

In FIG. 9C, an alternate approach to field replaceability of a cooled electronic system is depicted, wherein tubing is provided coupling the coolant manifold structures to subsystem-level coolant inlet manifold 951 and subsystem-level coolant outlet manifold 952. As illustrated in this figure, one coolant-cooled electronic module 960 and the associated coolant manifold structure 961 are coupled together and may be readily released to withdraw the subassembly from the associated conduits using, for instance, coupling assemblies 970, such as described herein. In one or more implementations, enhanced coupling assemblies or couplers may be employed, for instance, in connection with one or more of the liquid-cooled manifolds, manifold assemblies, cold plates, etc., of FIGS. 2-9C. Examples of these coupling assemblies are described below with reference to FIGS. 10A-12E.

Generally stated, disclosed herein are various coupling assemblies or couplers for facilitating connecting first and second fluid-carrying components. In one or more implementations, the coupling assembly may be configured and/or used to couple a conduit (or tube) to, for instance, a liquid manifold, such as one of the above-described coolant manifold structures. For instance, the coupling assemblies described herein could be used to couple a conduit or tube to coolant manifold structure 961 of FIGS. 9B & 9C, by way of example. Note, however, that the coupling assemblies disclosed herein may be employed in a variety of different types of liquid manifolds (or liquid manifold assemblies), including coolant manifold assemblies and non-coolant manifold assemblies. In the embodiments disclosed herein, the coupling assemblies may be secured to, or even integrated with, a first fluid-carrying component, such as the liquid manifold, for instance, at one or both of a liquid inlet or outlet to the liquid manifold. The coupling assemblies disclosed herein advantageously may be used to releasably secure a conduit to the liquid manifold with little torque, and without hinges or flanges.

Apparatuses are presented herein which include a coupling assembly facilitating connecting fluid-carrying components. The coupling assembly includes, for instance: a socket fitting with a first opening and a second opening in fluid communication through the socket fitting, the first opening being sized to accommodate a portion of a first fluid-carrying component therein, and the second opening being sized to accommodate a portion of a second fluid-carrying component therein; a sleeve, the sleeve encircling the socket fitting at least in part, and being constrained but rotatable relative to the socket fitting, the sleeve including a first locking feature; and a second locking feature associated with one fluid-carrying component of the first and second fluid-carrying components. The second locking features is positioned and sized relative to the one fluid-carrying component to engage the first locking feature when the one fluid-carrying component is inserted into a respective opening of the first and second openings in the socket fitting. Once engaged, rotating of the sleeve facilitates threadably locking the first and second locking features together to secure the one fluid-carrying component relative to the sleeve and the socket fitting.

In one or more implementations, the first locking feature includes first locking threads, and the second locking feature includes second locking threads. For instance, the first locking threads could be internal locking threads within the sleeve at an end of the sleeve, through which the one fluid-carrying component is inserted. Also, the coupling assembly may include an externally-threaded ring secured to the one fluid-carrying component, with the externally-threaded ring including the second locking threads. By way of example, the second locking threads could be located on an outer surface of the threaded ring so as to threadably engage the first locking threads when an end of the one fluid-carrying component is inserted into the sleeve and socket fitting assembly. In this manner, the coupling assembly may releasably seal the one fluid-carrying component to the socket fitting. A fluid-tight seal may be enhanced by providing at least one annular groove in a surface of the socket fitting, with the at least one annular groove accommodating, at least in part, at least one annular face seal. The at least one annular face seal is positioned and sized to engage the externally-threaded ring when the first and second locking threads are threadably locked together to form the fluid-tight seal between the one coolant-carrying component and the socket fitting. Alternatively, or additionally, one or more internal annular grooves may be provided within the socket fitting to accommodate, at least in part, one or more internal annular seals. The one or more internal annular seals may engage the one fluid-carrying component when the one fluid-carrying component is inserted into the respective opening of the socket fitting to facilitate forming the fluid-tight seal between the one fluid-carrying component and the socket fitting.

In one or more implementations, the sleeve may include a first end and a second end, with the first end including a first sleeve opening allowing the portion of the first fluid-carrying component to pass therethrough to facilitate coupling the first fluid-carrying component to the socket fitting through the first opening thereof, and the second end may include a second sleeve opening allowing the portion of the second fluid-carrying component to pass therethrough to facilitate coupling of the second fluid-carrying component to the socket fitting through the second opening thereof.

In certain embodiments, the coupling assembly may include a spring-biasing mechanism disposed internally between, for instance, the first end of the sleeve and the socket fitting, with such a spring-biasing mechanism biasing the socket fitting away from the first end of the sleeve.

In one or more embodiments, the first locking feature includes at least one groove in the sleeve adjacent to, for instance, the second end thereof, and the second locking feature may include at least one protrusion sized to extend into the at least one groove with coupling of the one fluid-carrying component to the socket fitting. For instance, the one fluid-carrying component may be the second fluid-carrying component, and the spring-biasing mechanism may force the at least one protrusion within the at least one groove against the sleeve when the second fluid-carrying component is coupled to the socket fitting. In this configuration, the at least one groove and at least one protrusion may cooperate to define a partial-turn locking of the fluid-carrying component to the sleeve, and thus, to the socket fitting to which the sleeve is constrained. In one implementation, multiple grooves and multiple protrusions, such as pins, may be provided to define, for instance, a quarter-turn locking of the fluid-carrying component and sleeve. In such implementations, the coupling assembly may include a ring secured to the fluid-carrying component, with the ring having the multiple pins extending therefrom, which are sized to extend into the multiple grooves in the sleeve.

As noted, the coupling assemblies disclosed herein may facilitate connecting a variety of first and second fluid-carrying components. For instance, in certain implementations, at least a portion of the coupling assembly may be secured to or formed integral with a liquid-carrying manifold or other liquid housing to facilitate, for instance, fluid-tight sealing of a conduit to the liquid-carrying manifold in a releaseable manner to facilitate replacement of the liquid-carrying manifold, or one or more electronic components associated therewith, such as described above. Advantageously, integrating or using a coupling assembly with a liquid-cooled assembly such as discussed herein allows for the separate removal of one of the liquid-cooled modules from the larger liquid-cooled assembly, such as might be employed in one of the electronic subsystem layouts described above.

Referring collectively to FIGS. 10A-10F, one embodiment of an apparatus 1000 is depicted comprising a coupling assembly 1001 facilitating connecting a first fluid-carrying component 1002 and a second fluid-carrying component 1003. As shown, in this example, apparatus 1000 includes a socket-side assembly 1010, and a plug-side assembly 1030, with the apparatus illustrated disconnected in FIG. 10A, and connected in FIG. 10E. By way of example only, the first and second fluid-carrying components are depicted in these figures as separate liquid conduits. Note that although illustrated in FIGS. 10A-10F as separate tubes or conduits, one or both of the fluid-carrying components 1002, 1003, could comprise a portion of any liquid-carrying assembly, such as a portion of a liquid-carrying manifold of a cooling assembly. By way of example, first fluid-carrying component 1002 could comprise a liquid inlet tube or a liquid outlet tube of a liquid-carrying assembly.

Figure 10C:
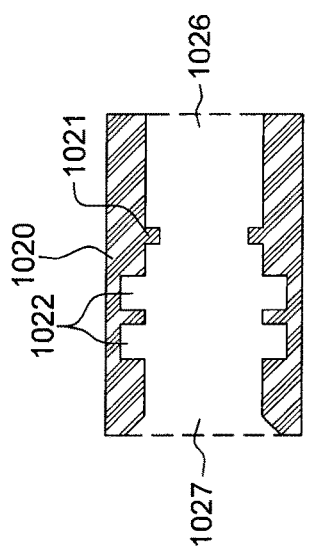
FIG. 10C is a cross-sectional elevational illustration of the socket fitting of the socket-side assembly of FIG. 10A, in accordance with one or more aspects of the present invention.
Figure 10D:
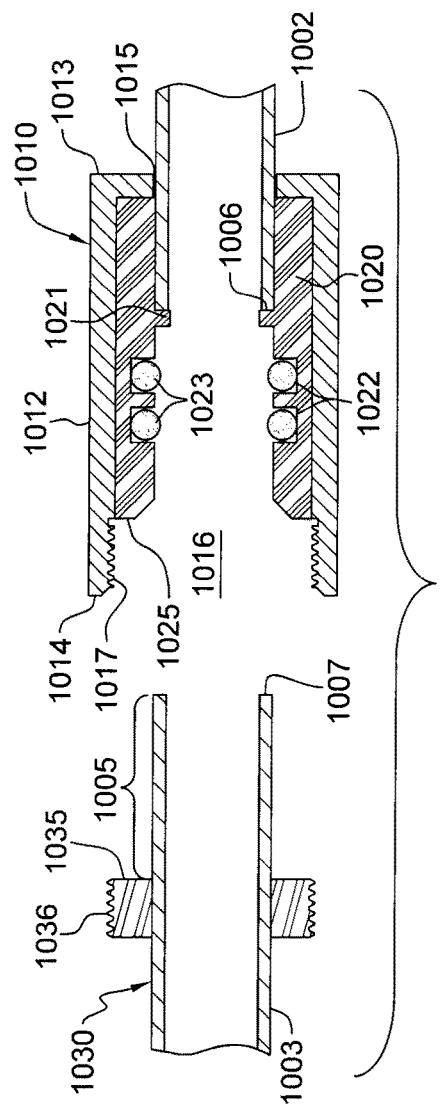
FIG. 10D is a cross-sectional elevational illustration of the disconnected socket-side and plug-side assemblies of FIG. 10A, in accordance with one or more aspects of the present invention.

As illustrated in FIGS. 10B-10D, in one embodiment, socket-side assembly 1010 includes, in addition to a portion of first fluid-carrying component 1002, a socket fitting 1020 and sleeve 1012. As depicted, sleeve 1012 includes a first end 1013 and a second end 1014, each with a respective opening 1015, 1016, through which a portion 1004, 1005 of the respective first and second fluid-carrying components 1002, 1003 may be inserted into socket fitting 1020. Sleeve 1012 is shown to, at least in part, encircle socket fitting 1020, and is rotatable relative to the socket fitting 1020 and partially constrained by the fitting. Sleeve 1012 includes a first locking feature, such as first locking threads 1017, adjacent to second end 1014 of sleeve 1012. As shown, in one or more implementations, first locking threads 1017 are internal locking threads, provided on an inner surface of sleeve 1012. As illustrated in FIGS. 10B & 10D, portion 1004 of first fluid-carrying component 1002 at an end 1006 thereof is inserted into the coupling assembly, and in particular, into socket fitting 1020 and sleeve 1012 contacting, for instance, a stop 1021 formed as an annular land within socket fitting 1020. In one or more implementations, first fluid-carrying component 1002 may be soldered, brazed, welded, or otherwise permanently secured and sealed to socket fitting 1020, in a manner as to still allow for rotation of sleeve 1012 relative to socket fitting 1020. Alternatively, socket fitting 1020 and first fluid-carrying component 1002 could be integrated as a unitary structure with, for instance, sleeve 1012 at one end and a connecting element, such as one or more hose barbs or NPT threads, at the other end.

As illustrated in FIG. 10C, socket fitting 1020 includes, in one embodiment, a first opening 1026 and a second opening 1027 in fluid communication through socket fitting 1020. Stop 1021 may be, as noted, an annular land extending from an inner surface of socket fitting 1020. Additionally, in one or more implementations, the inner surface of socket fitting 1020 may include one or more internal annular grooves 1022, each of which may be sized to accommodate, in part, a respective internal annular seal 1023, such as a respective O-ring seal. The axial length of socket fitting 1020 is chosen to be sufficient to accommodate receiving the portion 1004 of first fluid-carrying component 1002 therein, as well as a portion 1005 of second fluid-carrying component 1003, as illustrated in FIGS. 10D & 10F. As shown, portion 1005 of second fluid-carrying component 1003 is defined at an end 1007 of second fluid-carrying component 1003 to be inserted into socket-side assembly 1010, and in particular, into second opening 1027 (FIG. 10C) in socket fitting 1020.

Plug-side assembly 1030 is shown to further include, in the depicted embodiment, a threaded ring 1035, which includes the second locking threads 1036 on, for instance, an exterior surface or outer circumference thereof. The second locking threads 1036 are positioned and sized, along with portion 1005 of second fluid-carrying compartment 1003, to allow second locking threads 1036 to threadably engage first locking threads 1017 on the inside of sleeve 1012 with insertion of end 1007 into socket fitting 1020. In one or more implementations, second fluid-carrying component 1003 may be a metal conduit or tube, such as a copper tube, and threaded ring 1035 may be formed of metal as well. In such an implementation, threaded ring 1035 may be brazed, welded, or otherwise sealed, to second fluid-carrying component 1003. In one or more other embodiments, second fluid-carrying component 1003 may be formed of a non-metal, such as a plastic, and threaded ring 1035 may be otherwise sealed to second fluid-carrying component 1003. For instance, second fluid-carrying component 1003 and threaded ring 1035 may be molded together or otherwise integrated as a unitary structure to have the depicted plug-side assembly configuration. Also, note that the unitary structure could alternatively be formed out of metal.

As noted, FIGS. 10E & 10F depict apparatus 1000, with the plug-side assembly 1030 coupled to the socket-side assembly 1010. When connected, a fluid-tight seal is formed by, in part, one or more internal annular seals 1023 compressing against the portion 1005 of second fluid-carrying component 1003 inserted into socket fitting 1020. During the insertion, the first and second locking threads engage, and sleeve 1012 is rotated to threadably lock the plug-side assembly and socket-side assembly together. Since this locking is threadably achieved, the plug-side assembly and socket-side assembly may be subsequently released if desired, for instance, for repair or replacement of one or more associated structures. Also, note with reference to FIG. 10F, that in one embodiment, an end surface 1025 of socket fitting 1020 may function as a stop to the connecting of the plug-side assembly 1030 to the socket-side assembly 1010 by, for instance, contacting a side of threaded ring 1035 as the assemblies are threadably coupled. Alternatively, in one or more other implementations, annular land or stop 1021 could function as a stop for component 1003 by contacting end 1006 of second fluid-carrying component 1003 as it is threaded into the socket fitting.

As one detailed example of the apparatus of FIGS. 10A-10F, one or both of the fluid-carrying components 1002, 1003 may each comprise, for instance, metal tubing (such as copper tubing) or non-metal tubing (such as rigid or semi-rigid plastic tubing). In this configuration, the plug-side assembly represents that portion of the apparatus that is inserted into the socket-side assembly upon connection. In one or more embodiments, the plug-side assembly has a metal ring of a finite thickness, for instance, 5 mm or greater, that is, for instance, secured to the fluid-carrying component a prescribed distance from the end of the component. The outer diameter of the ring may have standard machine threading. The socket-side assembly may include a copper or brass socket fitting that is, for instance, brazed to the first fluid-carrying component (in one example only). The side of the socket fitting opposite to that accepting the brazed structure has a cylindrical cavity for accepting the plug-side assembly, and one or more internal annular grooves and annular seals, for a fluid-tight connection. The threaded sleeve fits over the socket fitting and is axially-constrained at one end by the fitting, but free to rotate relative to the socket fitting. The open end in the sleeve has internal threads that mate with the external threads on the plug-side assembly ring. Upon connection, the socket-side sleeve is threaded onto the plug-side ring, locking the fluid components together. Note that while in this example the sleeve is depicted as a smooth cylinder, it could (by design) have features such as flat regions, knurled surfaces, etc., to facilitate the threaded locking process.

FIGS. 11A-11E depict another embodiment of an apparatus 1100 comprising a coupling assembly, in accordance with one or more aspects of the present invention. Referring collectively to FIGS. 11A-11E, coupling assembly 1101 is shown to facilitate connecting a first fluid-carrying component 1102 and a second fluid-carrying component 1103. Apparatus 1100 again includes a socket-side assembly 1110, and a plug-side assembly 1130, with the apparatus shown disconnected in FIG. 11A, and connected in FIG. 11D. As with the above-discussed embodiments, although illustrated in FIGS. 11A-11E as separate conduits, one or both of fluid-carrying components 1102, 1103 could comprise a portion of any liquid-carrying assembly, such as a portion of a liquid-carrying manifold or cold plate of a cooling assembly. By way of example, first fluid-carrying component 1102 could be a liquid inlet tube or a liquid outlet tube of a liquid manifold assembly of a cooling system such as described above.

FIGS. 11B & 11C illustrate one detailed embodiment of socket-side assembly 1110. As depicted, socket-side assembly 1110 includes, in addition to a portion of first fluid-carrying component 1102, a socket fitting 1120, internal annular seals 1123, a spring-biasing mechanism 1129, and a sleeve 1112. Sleeve 1112 includes a first end 1113 and a second end 1114, each with a respective opening, with opening 1116 at second end 1114 being depicted in FIG. 11B. As explained above, a portion 1104, 1105 of the first and second fluid-carrying components 1102, 1103, may be inserted into the socket fitting 1120 through the respective sleeve openings. Sleeve 1112 is shown to, at least in part, encircle socket fitting 1120, and is rotatable relative to socket fitting 1120, and partially constrained by the fitting, as in the example explained above in connection with FIGS. 10A-10F. Sleeve 1120 also includes a first locking feature, such as at least one groove 1117 adjacent to second end 1114 of sleeve 1112. As shown, in one or more implementations, the at least one groove 1117 comprises, by way of example, two quarter-turn locking grooves which receive respective protrusions or pins associated with the second fluid-carrying component 1103, as explained below.

Figure 11D:
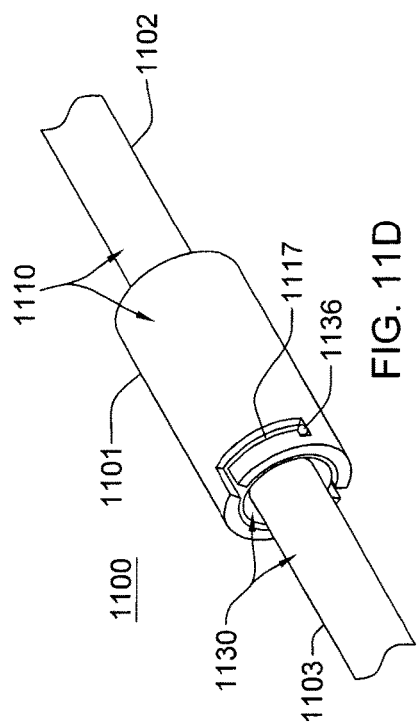
FIG. 11D depicts the apparatus of FIG. 11A, with the plug-side and socket-side assemblies shown connected, in accordance with one or more aspects of the present invention.
Figure 11E:
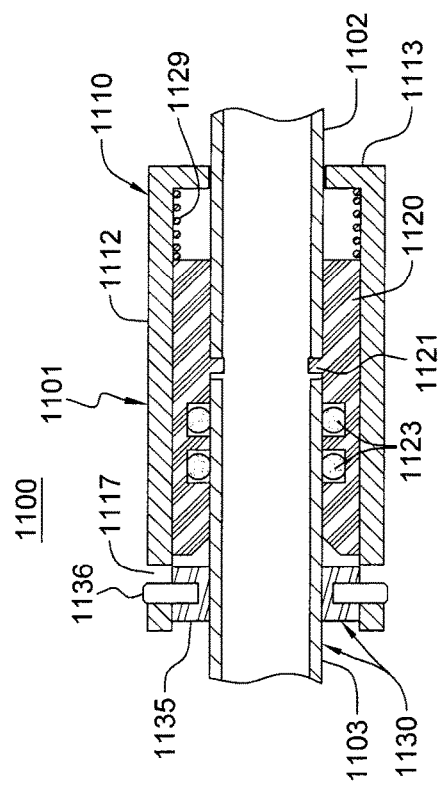
FIG. 11E is a cross-sectional elevational depiction of the connected apparatus of FIG. 11D, in accordance with one or more aspects of the present invention.

As depicted in FIGS. 11B & 11E, a portion 1104 of first fluid-carrying component 1102 at an end 1106 thereof is inserted into the coupling assembly, and in particular, into socket fitting 1120 and sleeve 1112 contacting, for instance, a stop 1121 formed as an annular land within socket fitting 1120. In one or more implementations, first fluid-carrying component 1102 may be soldered, brazed, welded, or otherwise permanently secured and sealed to socket fitting 1120 in a manner so as to still allow for rotation of sleeve 1112 relative to socket fitting 1120. As shown in FIG. 11E, spring-biasing mechanism 1129 is disposed internally between the first end 1113 of sleeve 1112 and socket fitting 1120. Spring-biasing mechanism 1129 is provided, in one or more implementations, to bias the socket fitting 1120 away from first end 1113 of sleeve 1112. This, in turn, forces the one or more protrusions or pins 1136 associated with second fluid-carrying component 1103 against sleeve 1112 to more securely hold the pins in position. As illustrated in FIG. 11B, the respective grooves 1117 in sleeve 1120 may include an L-shaped terminus at which the protrusion resides when locked in place. This requires a purposeful action to unlock the connection.

As illustrated in FIG. 11C, socket fitting 1120 includes, in one embodiment, a first opening 1126 and a second opening 1127 in fluid communication through socket fitting 1120. Stop 1121 may be, as noted, an annular land extending from an inner surface of socket fitting 1120. Additionally, in one or more implementations, the inner surface of socket fitting 1120 may include one or more internal annular grooves 1122, each of which may be sized to accommodate, in part, a respective internal annular seal 1123 (FIG. 11B), such as a respective O-ring seal. The axial length of socket fitting 1120 may be chosen to be sufficient to accommodate receiving the portion 1104 of first fluid-carrying component 1102 therein, as well as a portion 1105 of second fluid-carrying component 1103 at an end 1107 of second fluid-carrying component 1103 to be inserted into socket-side assembly 1110.

Plug-side assembly 1130 is shown to further include, in the depicted embodiment, a ring 1135, which includes one or more protrusions 1136 on, for instance, an exterior surface or outer circumference thereof. The one or more protrusions, such as multiple pins, are positioned and sized, along with portion 1105 of second fluid-carrying compartment 1103, to allow the protrusions 1136 to insert into the one or more grooves 1117 at second end 1114 of sleeve 1112 with insertion of end 1107 into socket fitting 1120. This allows for a simple, quarter-turn action to lock and unlock the plug-side assembly 1130 from the socket-side assembly 1110. The spring-biasing mechanism 1129 advantageously maintains the protrusions within the recessed groove at the terminus of the groove(s) 1117 in the rotatable sleeve 1112.

In one or more implementations, second fluid-carrying component 1103 may again be a metal conduit or tube, such as a copper tube, and ring 1135 may be formed of metal as well. In such an implementation, ring 1135 may be brazed, welded, or otherwise sealed, to second fluid-carrying component 1103. In other embodiments, second fluid-carrying component 1103 may be formed of a non-metal, such as a plastic, and ring 1135 may be otherwise sealed to second fluid-carrying component 1103. For instance, ring 1135 having protrusions 1136 and second fluid-carrying component 1103 may be molded together as a unitary structure to have the depicted plug-side assembly configuration.

As noted, FIGS. 11D & 11E depict apparatus 1100, with plug-side assembly 1130 coupled to socket-side assembly 1110. When connected, a fluid-tight seal is formed by, in part, one or more internal annular seals 1123 compressing against the portion 1105 of second fluid-carrying component 1103 inserted into socket fitting 1120. During the insertion, protrusions 1136 are aligned to grooves 1117 in sleeve 1112 and pressed into the grooves, compressing spring-biasing mechanism 1129. In the example illustrated, a quarter-turn rotation of sleeve 1112 positions protrusions 1136 in the respective receiving recesses at the ends of the grooves. As noted, spring-biasing mechanism 1129 maintains the protrusions 1136 in the locked position within the respective receiving grooves until positive force is applied to disconnect the coupling assembly.

FIGS. 12A-12E depict still another embodiment of an apparatus 1200 comprising a coupling assembly, in accordance with one or more aspects of the present invention. Referring collectively to FIGS. 12A-12E, apparatus 1200 is shown to include coupling assembly 1201 which facilitates connecting a first fluid-carrying component 1202 and a second fluid-carrying component 1203. The apparatus is again shown to include a socket-side assembly 1210, and a plug-side assembly 1230, with the apparatus illustrated disconnected in FIG. 12A, and connected in FIG. 12E. As in the embodiments described above, the fluid-carrying components 1202, 1203 are illustrated as tubes or conduits, by way of example only. In other embodiments, one or more of the tubes could comprise a portion of any liquid-carrying assembly, such as a portion of a liquid-carrying manifold of a cooling assembly. By way of example, first fluid-carrying component 1202 could comprise a liquid inlet tube or a liquid outlet tube of a liquid-carrying manifold, such as described above.

Figure 12D:
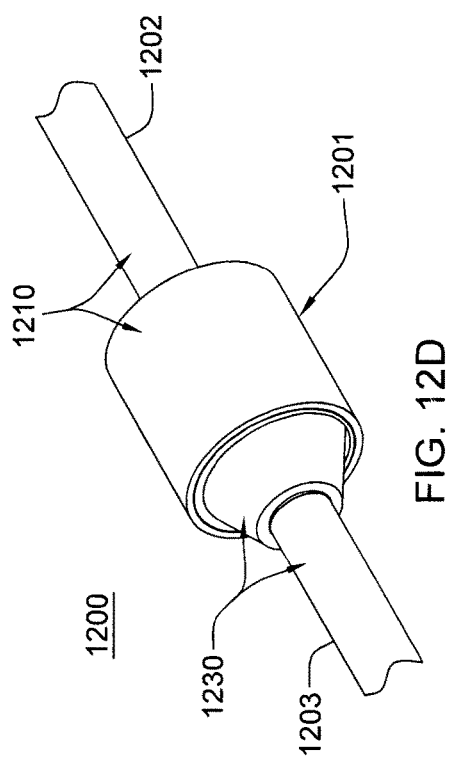
FIG. 12D shows the apparatus of FIG. 12A, with the plug-side and socket-side assemblies shown connected, in accordance with one or more aspects of the present invention.
Figure 12E:
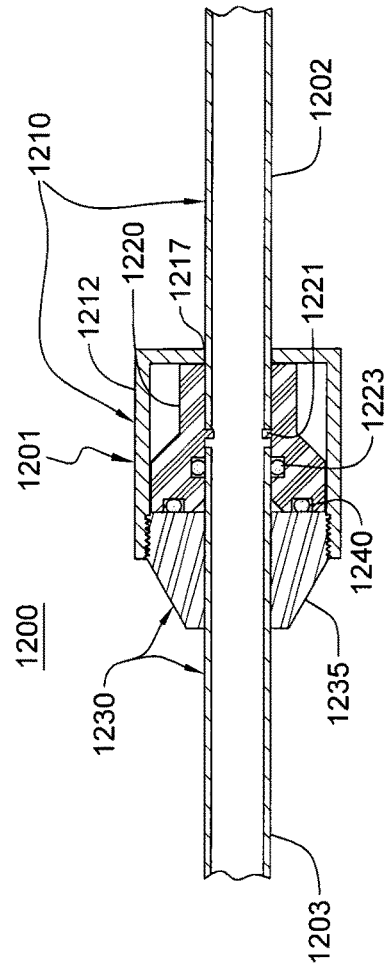
FIG. 12E is a cross-sectional elevational view of the connected apparatus of FIG. 12D, in accordance with one or more aspects of the present invention.

FIGS. 12B & 12C depict one embodiment of socket-side assembly 1210. As illustrated, socket-side assembly 1210 includes, in addition to a portion of first fluid-carrying component 1202, a socket fitting 1220 and a sleeve 1212. In one or more embodiments, sleeve 1212 includes a first end 1213 and a second end 1214, each with a respective opening through which a portion of the respective first and second fluid-carrying components may be inserted into socket fitting 1220. Sleeve 1212 is shown to, at least in part, encircle socket fitting 1220, and is rotatable relative to socket fitting 1220, and partially constrained by the fitting when assembled, as depicted in FIGS. 12D & 12E.

In one or more implementations, sleeve 1212 includes a first locking feature, such as first locking threads 1217 located adjacent to opening 1216 at second end 1214 of sleeve 1212. In one or more embodiments, first locking threads 1217 are internal locking threads provided on an inner surface of sleeve 1212. As illustrated in FIG. 12E, a portion of first fluid-carrying component 1202 at an end thereof is inserted into the coupling assembly, and in particular, into socket fitting 1220 and sleeve 1212 contacting, for instance, a stop 1221 formed as an annular land within socket fitting 1220. In one or more implementations, first fluid-carrying component 1202 may be soldered, brazed, welded, or otherwise permanently secured and sealed to socket fitting 1220 in a manner so as to still allow for rotation of sleeve 1212 relative to socket fitting 1220.

As illustrated in FIG. 12C, socket fitting 1220 includes, in one embodiment, a first opening 1226 and a second opening 1227 in fluid communication through socket fitting 1220. Stop 1221 may be, as noted, an annular land extending from an inner surface of socket fitting 1220. Additionally, in one or more implementations, the inner surface of socket fitting 1220 may include one or more internal annular grooves 1222, each of which may be sized to accommodate, in part, a respective internal annular seal 1223 (FIG. 12B), such as a respective O-ring seal. Also, in this embodiment, an end surface 1225 of socket fitting 1220 may include at least one annular groove 1241 accommodating, in part, at least one annular face seal 1240 (FIG. 12B). As illustrated in FIG. 12E, when the socket-side assembly and plug-side assembly are connected, the at least one annular face seal 1240 engages a threaded ring 1235 associated with second fluid-carrying component 1203 to facilitate forming a fluid-tight seal between the second fluid-carrying component and the socket fitting. Note that the axial length of socket fitting 1220 may be chosen to be sufficient to accommodate receiving the respective portions of the first and second fluid-carrying components 1202, 1203, as illustrated in FIGS. 12A-12E.

As noted, plug-side assembly 1230 includes a threaded ring 1235, which has second locking threads 1236 on, for instance, an exterior surface or outer circumference thereof. Second locking threads 1236 are positioned and sized to threadably engage first locking threads 1217 on the inside of sleeve 1212 with insertion of second fluid-carrying component 1203 into socket fitting 1220. In one or more implementations, second fluid-carrying component 1203 may be a metal conduit or tube, such as a copper tube, and threaded ring 1235 may be formed of metal as well. In such implementations, threaded ring 1235 may be soldered, brazed, welded, or otherwise sealed, to second fluid-carrying component 1203. As with the embodiments noted above, in other implementations, second fluid-carrying component 1203 may be formed of a non-metal, such as a plastic, and threaded ring 1235 may be otherwise sealed to second fluid-carrying component 1203. For instance, second fluid-carrying component 1203 and threaded ring 1235 may be molded together as a unitary structure to have the depicted plug-side assembly configuration.

FIGS. 12D & 12E depict apparatus 1200, with plug-side assembly 1230 coupled to socket-side assembly 1210. When connected, a fluid-tight seal is formed by, in part, the one or more internal annular seals 1223 compressing against second fluid-carrying component 1203 inserted into socket fitting 1220, and the one or more annular face seals 1240 compressing against threaded ring 1235 when the first and second locking threads are threadably locked. During insertion of the second fluid-carrying component 1203 into socket fitting 1220, the first and second locking threads engage, and sleeve 1220 is rotated to threadably lock the plug-side assembly and socket-side assembly together. Since the locking is threadably achieved, the plug-side assembly and socket-side assembly may be subsequently released if desired, for instance, for repair or replacement of one or more associated structures. Also, note with reference to FIG. 12E, that in one embodiment, the end surface 1225 of socket fitting 1220 may function as a stop to the connecting of the plug-side assembly 1230 to socket-side assembly 1210 by, for instance, contacting the side of threaded ring 1235 as the assemblies are threadably coupled. Alternatively, in one or more other implementations, annular land or stop 1221 could function as a stop for second fluid-carrying component 1203 by contacting the end of the component as it coupled within the socket fitting. Note also, that in the embodiments of FIGS. 12A-12E, the threaded ring 1235 has a larger diameter than the threaded ring 1035 of the embodiment of FIGS. 10A-10F. This larger diameter in part facilitates brazing of the threaded ring to the second fluid-carrying component 1203, and thus, facilitates a strong braze joint which is capable of withstanding the mechanical forces required to properly make, for instance, the face seal disclosed herein.

Those skilled in the art will note that variations on the embodiments described above can accommodate rigid or semi-rigid plastic tubing. For instance, the plug-side assembly ring and/or the socket fitting could be made of a suitable plastic to effectively bond the respective plastic tubing. Alternatively, the socket fitting could be made to have a hose barb termination for joining the plastic or EPDM tubing. Additionally, rather than attaching the plug ring directly to the tube, the plug-side fitting could be made to properly mate and seal with the socket-side assembly, and accept any tube or hose desired.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. An apparatus comprising:
a coupling assembly to facilitate connecting a first fluid-carrying tube and a second fluid-carrying tube, the coupling assembly comprising:
a socket fitting with a first opening and a second opening in fluid communication through the socket fitting and separated by an annular land within the socket fitting, the socket fitting being a single piece fitting, the first opening being sized to accommodate a portion of the first fluid-carrying tube therein, and the second opening being sized to accommodate a portion of the second fluid-carrying tube therein, the annular land being an abutment stop for the portion of the first fluid-carrying tube within the first opening of the socket fitting and an abutment stop for the portion of the second fluid-carrying tube within the second opening of the socket fitting;
wherein the socket fitting and the first fluid-carrying tube are permanently bonded together in a fluid tight seal, with the portion of the first fluid-carrying tube within the first opening in the socket fitting;
a sleeve, the sleeve encircling the socket fitting and being rotatable relative to the socket fitting and the first fluid-carrying tube without effecting the fluid tight seal, the sleeve being sized for the socket fitting to reside fully therein, along with the portion of the first fluid-carrying tube and the portion of the second fluid-carrying tube, and wherein the sleeve is partially constrained in an axial direction at a first end by contact with an end surface of the socket fitting having the first opening and the sleeve comprises a first locking feature;
a second locking feature associated with the second fluid-carrying tube, the second locking feature being positioned and sized to engage the first locking feature when the second fluid-carrying tube is inserted into the sleeve and within the second opening in the socket fitting, and wherein, once engaged, rotating of the sleeve facilitates locking the first and second locking features together to secure the second fluid-carrying tube to the socket fitting; and
wherein the socket fitting comprises at least one internal annular groove accommodating, in part, at least one annular seal, the at least one annular seal engaging the second fluid-carrying tube when the second fluid-carrying tube is inserted into the second opening in the socket fitting to facilitate forming a fluid-tight seal between the second fluid-carrying tube and the socket fitting.

2. The apparatus of claim 1, wherein the first locking feature comprises first locking threads, and the second locking feature comprises second locking threads.

3. The apparatus of claim 2, wherein the first locking threads comprise internal locking threads within the sleeve.

4. The apparatus of claim 2, wherein the coupling assembly further comprises an external threaded ring secured to the second fluid-carrying tube, the external threaded ring comprising the second locking threads, and the ring secured to the second fluid-carrying tube contacting an end surface of the socket fitting having the second opening.

5. The apparatus of claim 1, wherein the sleeve comprises a first end and a second end, the first end comprising a first sleeve opening allowing the portion of the first fluid-carrying tube to pass therethrough, and the second end comprising a second sleeve opening allowing the portion of the second fluid-carrying tube to pass therethrough to facilitate coupling of the second fluid-carrying tube to the socket fitting through the second opening thereof.

6. An apparatus comprising:
a first fluid-carrying component and a second fluid-carrying component; and
a coupling assembly to connect the first fluid-carrying component to a second fluid-carrying component, the coupling assembly comprising:
a socket fitting with a first opening and a second opening in fluid communication through the socket fitting and separated by an annular land within the socket fitting, the socket fitting being a single piece fitting, the first opening being sized to accommodate a portion of the first fluid-carrying component therein, and the second opening being sized to accommodate a portion of the second fluid-carrying component therein, the annular land being an abutment stop for the portion of the first fluid-carrying component within the first opening of the socket fitting and an abutment stop for the portion of the second fluid-carrying component within the second opening of the socket fitting;
wherein the socket fitting and the first fluid-carrying component are permanently bonded together in a fluid tight seal, with the portion of the first fluid-carrying component within the first opening in the socket fitting;
a sleeve, the sleeve encircling the socket fitting, and being rotatable relative to the socket fitting and the first fluid-carrying component without effecting the fluid tight seal, the sleeve being sized for the socket fitting to reside fully therein, along with the portion of the first fluid-carrying component and the portion of the second fluid-carrying component, and wherein the sleeve is partially constrained in an axial direction at a first end by contact with an end surface of the socket fitting having the first opening, and the sleeve comprises a first locking feature at a second end thereof;
a second locking feature associated with the second fluid-carrying component, the second locking feature being positioned and sized to engage the first locking feature when the second fluid-carrying component is inserted into the sleeve and within the second opening within the socket fitting, and wherein, once engaged, rotating of the sleeve locks the first and second locking features together to secure the second fluid-carrying component to the socket fitting; and
wherein the socket fitting comprises at least one internal annular groove accommodating, in part, at least one annular o-ring seal, the at least one annular o-ring seal engaging the second fluid-carrying component when the second fluid-carrying component is inserted into the second opening in the socket fitting to facilitate forming a fluid-tight seal between the second fluid-carrying component and the socket fitting.

7. The apparatus of claim 6, wherein the first fluid-carrying component comprises a liquid manifold assembly facilitating cooling of one or more electronic components, the socket fitting being disposed at one of a liquid inlet or a liquid outlet of the first fluid-carrying component.

8. The apparatus of claim 6, wherein the first locking feature comprises first locking threads, and the second locking feature comprises second locking threads, the first locking threads being internal locking threads within the sleeve, and the coupling assembly further including an external threaded ring secured to the second fluid-carrying component, the external threaded ring comprising the second locking threads, and the ring secured to the second fluid-carrying tube contacting an end surface of the socket fitting having the second opening.

\* \* \* \* \*